United States Patent
Hirano et al.

(10) Patent No.: US 8,530,119 B2
(45) Date of Patent: Sep. 10, 2013

(54) POSITIVE PHOTOSENSITIVE RESIN COMPOSITION, CURED FILM, PROTECTIVE FILM, INTERLAYER INSULATING FILM, AND SEMICONDUCTOR DEVICE AND DISPLAY ELEMENT USING THE SAME

(75) Inventors: Takashi Hirano, Tokyo (JP); Toshio Banba, Tokyo (JP); Shusaku Okamyo, Tokyo (JP); Hiroaki Makabe, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/321,180

(22) PCT Filed: May 20, 2009

(86) PCT No.: PCT/JP2009/059639
§ 371 (c)(1),
(2), (4) Date: Jan. 3, 2012

(87) PCT Pub. No.: WO2010/134207
PCT Pub. Date: Nov. 25, 2010

(65) Prior Publication Data
US 2012/0100484 A1   Apr. 26, 2012

(51) Int. Cl.
*G03F 7/023*   (2006.01)
(52) U.S. Cl.
CPC ................... *G03F 7/0233* (2013.01)
USPC ............. 430/18; 430/191; 430/192; 430/193; 430/270.1
(58) Field of Classification Search
CPC .................................................. G03F 7/0233
USPC ........................ 430/18, 191, 192, 193, 270.1
See application file for complete search history.

(56) References Cited

U.S. PATENT DOCUMENTS 6,235,436 B1 * 5/2001 Hirano et al. .................... 430/18
2003/0118941 A1  6/2003 Hayakawa et al.

FOREIGN PATENT DOCUMENTS

| JP | 56-27140 A | 3/1981 |
| JP | 2001-100416 A | 4/2001 |
| JP | 2002-201230 A | 7/2002 |
| JP | 2002-229206 A | 8/2002 |
| JP | 2007-78812 A | 3/2007 |
| JP | 2009-75182 A | 4/2009 |

OTHER PUBLICATIONS

International Search Report issued in PCT/JP2009/059639, dated Jun. 23, 2009.
Written Opinion issued in PCT/JP2009/059639, dated Jun. 23, 2009.

* cited by examiner

*Primary Examiner* — John Chu
(74) *Attorney, Agent, or Firm* — Birch, Stewart, Kolasch & Birch, LLP

(57) ABSTRACT

A positive photosensitive resin composition includes (A) a polybenzoxazole precursor resin, (B) a photosensitive diazoquinone compound, (C) a hindered phenol antioxidant shown by the following general formula (1), and (D) a phenol compound shown by the following general formula (2). Formula (1) is:

wherein $R_1$ represents a hydrogen atom or an organic group having 1 to 4 carbon atoms, a is an integer from 1 to 3, and b is an integer from 1 to 3. Formula (2) is:

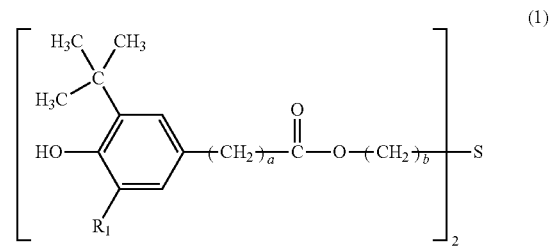

wherein $R_2$ represents a methylene group or a single bond, c is an integer from 1 to 3, and d is an integer from 1 to 3. A protective film, an interlayer insulating film, and a semiconductor device and a display element using the same are also disclosed.

13 Claims, No Drawings

POSITIVE PHOTOSENSITIVE RESIN COMPOSITION, CURED FILM, PROTECTIVE FILM, INTERLAYER INSULATING FILM, AND SEMICONDUCTOR DEVICE AND DISPLAY ELEMENT USING THE SAME

TECHNICAL FIELD

The invention relates to a positive photosensitive resin composition, a cured film (layer), a protective film (layer), an interlayer insulating film (layer), and a semiconductor device and a display element (device) using the same.

BACKGROUND ART

A polyimide resin or the like that exhibits excellent heat resistance, electrical properties, mechanical properties, and the like has been used as a material for forming a surface protective film or an interlayer insulating film (interlayer dielectric) of a semiconductor element (device). In recent years, a polybenzoxazole resin that exhibits excellent moisture-proof reliability due to the absence of a carbonyl group derived from a highly polar imide ring has been used for forefront semiconductor elements (devices). A photosensitive resin composition that includes a photosensitive polybenzoxazole resin or a photosensitive polyimide resin, and simplifies the patterning process (i.e., achieves a reduction in process time and an increase in yield) has been developed.

A positive photosensitive resin composition that can be developed using an alkaline aqueous solution has been proposed from the viewpoint of safety. For example, Patent Document 1 discloses a positive photosensitive resin composition that contains a polybenzoxazole precursor resin (i.e., base resin) and a diazoquinone compound (photosensitizer). The positive photosensitive resin composition disclosed in Patent Document 1 exhibits high heat resistance and excellent electrical properties, enables microfabrication, and may be used as a wafer coating material or an interlayer insulating resin composition. The positive photosensitive resin composition utilizes the following development mechanism. The diazoquinone compound present in the unexposed area is insoluble in an alkaline aqueous solution (developer), and interacts with the base resin to implement resistance to the alkaline aqueous solution. The diazoquinone compound becomes soluble in the alkaline aqueous solution upon exposure due to chemical changes, and promotes dissolution of the base resin. The exposed area is dissolved and removed by utilizing the difference in solubility between the exposed area and the unexposed area to obtain a film pattern formed by the unexposed area.

The polybenzoxazole precursor resin included in the positive photosensitive resin composition is dehydrated and cyclized when the polybenzoxazole precursor resin is cured at a high temperature of about 300° C. after forming the film pattern, so that a polybenzoxazole resin that exhibits high heat resistance is obtained. However, the polybenzoxazole resin and the diazoquinone compound are oxidized and decomposed when curing the polybenzoxazole precursor resin, so that the film blackens. A further heat treatment is performed during the semiconductor production process after curing the polybenzoxazole precursor resin. For example, when producing an LOC structure, a lead frame provided with an LOC tape is bonded to a chip at a high temperature of 350 to 450° C. In this case, the polybenzoxazole resin applied to the chip further blackens. A problem (recognition failure) occurs due to discoloration during the subsequent wire bonding step. Therefore, a positive photosensitive resin composition that produces a cured film that has a light color and is discolored to only a small extent even when heated at a high temperature has been desired.

It is important for the positive photosensitive resin composition to exhibit high sensitivity. If the positive photosensitive resin composition exhibits low sensitivity, a decrease in throughput occurs due to an increase in exposure time. When reducing the molecular weight of the base resin in order to improve the sensitivity of the positive photosensitive resin composition, a film loss in the unexposed area may increase during development (i.e., the desired thickness may not be obtained), or the resolution may decrease.

Patent Document 2 discloses a positive photosensitive resin composition that contains a hindered phenol antioxidant having a specific structure, and produces a cured film that has a light color and is discolored to only a small extent due to heating. Patent Document 3 discloses a positive photosensitive resin composition that contains a phenol compound having a specific structure, and exhibits high sensitivity and high resolution.

RELATED-ART DOCUMENT

Patent Document (Patent Document 1) JP-A-56-27140 (claims)
(Patent Document 2) JP-A-2001-100416 (claims)
(Patent Document 3) JP-A-2002-229206 (claims)

SUMMARY OF THE INVENTION

Problems to be Solved by the Invention

In recent years, the performance of semiconductor elements has been significant improved, and an increase in yield of semiconductor elements has been desired. It is important to improve reliability by increasing adhesion to a substrate such as a silicon wafer, a passivation layer (film) (e.g., $SiO_2$ or $Si_3N_4$), or a metal film in order to achieve an increase in yield.

Patent Document 2 can produce a cured film that has a light color and is discolored to only a small extent due to heating, and Patent Document 3 can achieve high sensitivity and high resolution. According to such related-art technology, however, it is very difficult to simultaneously implement (i) an improvement in sensitivity and resolution, (ii) production of a cured film that has a light color and is discolored to only a small extent due to heating, and (iii) production of a cured film that exhibits improved adhesion to a substrate.

Accordingly, an object of the invention is to provide a positive photosensitive resin composition that exhibits high sensitivity and high resolution, and can produce a cured film that has a light color, is discolored to only a small extent due to heating, and exhibits high adhesion to a substrate, as well as a protective film, an interlayer insulating film, and a semiconductor device and a display element using the same.

Means for Solving the Problems

The above object can be achieved by the following (see [1] to [10]).

[1] A positive photosensitive resin composition including (A) a polybenzoxazole precursor resin, (B) a photosensitive diazoquinone compound, (C) a hindered phenol antioxidant shown by a general formula (1), and (D) a phenol compound shown by a general formula (2),

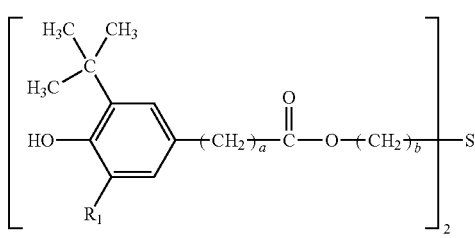
(1)

wherein $R_1$ represents a hydrogen atom or an organic group having 1 to 4 carbon atoms, a is an integer from 1 to 3, and b is an integer from 1 to 3,

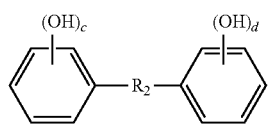
(2)

wherein $R_2$ represents a methylene group or a single bond, c is an integer from 1 to 3, and d is an integer from 1 to 3.

[2] The positive photosensitive resin composition according to [1], including 1 to 50 parts by mass of the photosensitive diazoquinone compound (B), 1 to 20 parts by mass of the hindered phenol antioxidant (C) shown by the general formula (1), and 1 to 50 parts by mass of the phenol compound (D) shown by the general formula (2) based on 100 parts by mass of the polybenzoxazole precursor resin (A).

[3] The positive photosensitive resin composition according to [1], wherein a ratio ((D)/(C)) of a content of the phenol compound (D) shown by the general formula (2) to a content of the hindered phenol antioxidant (C) shown by the general formula (1) is 1 to 50.

[4] The positive photosensitive resin composition according to [1], wherein the polybenzoxazole precursor resin (A) includes at least one structural unit selected from the group consisting of structural units shown by a formula (3),

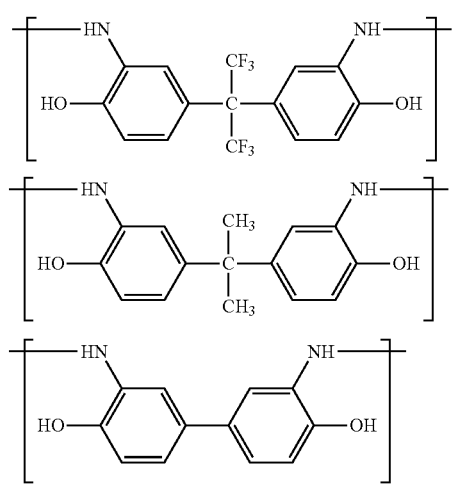
(3)

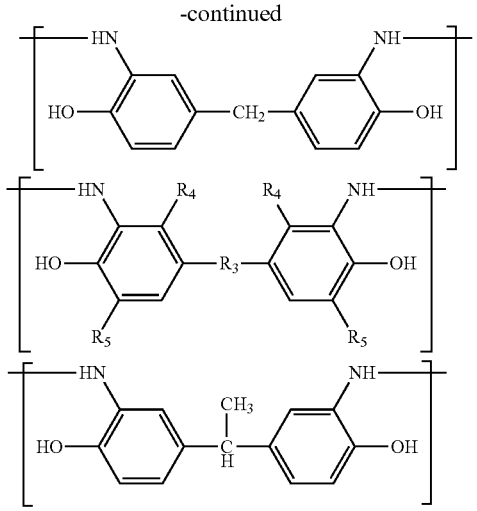

wherein $R_3$ represents a group selected from the group consisting of an alkylene group, a substituted alkylene group, —O—, —S—, —SO$_2$—, —CO—, —NHCO—, —C(CF$_3$)$_2$—, and a single bond, $R_4$ individually represent an alkyl group, an alkoxy group, an acyloxy group, or a cycloalkyl group, two $R_4$s may be the same or different, and $R_5$ individually represent a hydrogen atom, an alkyl group, an alkoxy group, an acyloxy group, or a cycloalkyl group, two $R_5$s may be the same or different.

[5] The positive photosensitive resin composition according to [1], wherein the phenol compound (D) is at least one compound selected from the group consisting of compounds shown by a formula (4),

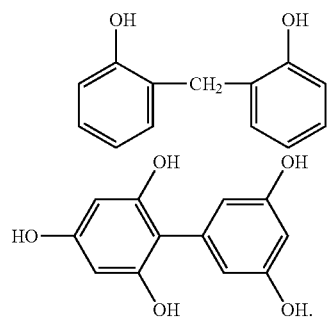
(4)

[6] The positive photosensitive resin composition according to [1], wherein the polybenzoxazole precursor resin (A) has a dissolution rate in a 2.38% tetramethylammonium hydroxide aqueous solution of 10 to 300 nm/sec.

[7] A cured film including a cured product of the positive photosensitive resin composition according to [1].

[8] A protective film including the cured film according to [7].

[9] An insulating film including the cured film according to [7].

[10] A semiconductor device including the cured film according to [7].

[11] A display device including the cured film according to [7].

Effects of the Invention

The invention thus provides a positive photosensitive resin composition exhibits high sensitivity and high resolution, and can produce a cured film that has a light color, is discolored to only a small extent due to heating, and exhibits high adhesion to a substrate, a cured film, a protective film, an interlayer insulating film, and a semiconductor device and a display element using the same.

DESCRIPTION OF EXEMPLARY EMBODIMENTS

A positive photosensitive resin composition according to one embodiment of the invention includes (A) a polybenzoxazole precursor resin, (B) a photosensitive diazoquinone compound, (C) a hindered phenol antioxidant shown by the following general formula (1), and (D) a phenol compound shown by the following general formula (2).

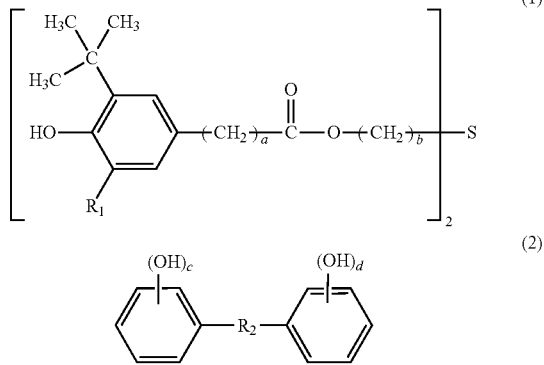

A protective film and an interlayer insulating film according to embodiments of the invention include a cured product of the positive photosensitive resin composition. A semiconductor device and a display device according to embodiments of the invention include the protective film or the interlayer insulating film.

Each component of the positive photosensitive resin composition according to one embodiment of the invention is described in detail below. Note that the invention is not limited to the following exemplary disclosure.

The polybenzoxazole precursor resin (A) included in the positive photosensitive resin composition according to one embodiment of the invention includes a structure derived from a bis(aminophenol) and a dicarboxylic acid. Specifically, the polybenzoxazole precursor resin (A) is a polyamide resin obtained by reacting a diamine component and a carboxylic acid component, wherein a bis(aminophenol) is used as the entirety or part of the diamine component. Therefore, the polybenzoxazole precursor resin (A) includes the following benzoxazole precursor skeleton in the main chain.

Benzoxazole Precursor Structure:

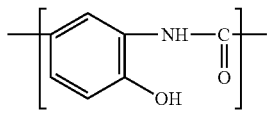

The polybenzoxazole precursor resin (A) is dehydrated and cyclized when heated at 150 to 380° C. to form a heat-resistant resin having a benzoxazole skeleton.

The polybenzoxazole precursor resin (A) preferably includes one or more structural units among the structural units shown by the following formulas (3-1) to (3-6). The structural units shown by the formulas (3-1) to (3-6) are structural units derived from the diamine component. These structural units are bonded to the structural unit derived from the dicarboxylic acid component in the resin via an amide bond.

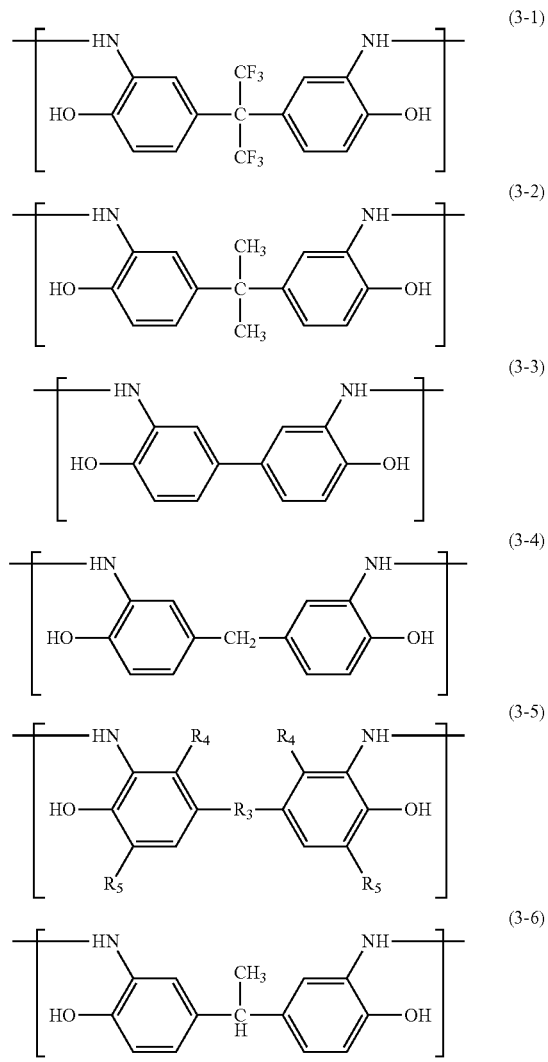

wherein $R_3$ represents a group selected from an alkylene group, a substituted alkylene group, —O—, —S—, —SO$_2$—, —CO—, —NHCO—, —C(CF$_3$)$_2$—, and a single bond, $R_4$ individually represent an alkyl group, an alkoxy group, an acyloxy group, or a cycloalkyl group, two $R_4$s may be the same or different, and $R_5$ individually represent a hydrogen atom, an alkyl group, an alkoxy group, an acyloxy group, or a cycloalkyl group, two $R_5$s may be the same or different.

Specific examples of the alkylene group and the substituted alkylene group represented by $R_3$ in the formula (3-5) include —CH$_2$—, —CH(CH$_3$)—, —C(CH$_3$)$_2$—, —CH(CH$_2$CH$_3$)—, —C(CH$_3$)(CH$_2$CH$_3$)—, —C(CH$_2$CH$_3$)(CH$_2$CH$_3$)—, —CH(CH$_2$CH$_2$CH$_3$)—, —C(CH$_3$)(CH$_2$CH$_2$CH$_3$)—, —CH(CH(CH$_3$)$_2$)—, —C(CH$_3$)(CH(CH$_3$)$_2$)—, —CH(CH$_2$CH$_2$CH$_2$CH$_3$)—, —C(CH$_3$)(CH$_2$CH$_2$CH$_2$CH$_3$)—, and the like. Among these, —CH$_2$—, —CH(CH$_3$)—, and —C(CH$_3$)$_2$— are preferable since a polybenzoxazole precursor resin that exhibits high sensitivity and sufficient solubility in a solvent in a well-balanced manner can be obtained.

Specific examples of the alkyl group represented by R$_4$ and R$_5$ in the formula (3-5) include —CH$_3$, —CH$_2$CH$_3$, —CH$_2$CH$_2$CH$_3$, —CH(CH$_3$)$_2$, —CH$_2$CH$_2$CH$_2$CH$_3$, —CH$_2$CH(CH$_3$)$_2$, —CH(CH$_3$)(CH$_2$CH$_3$), —C(CH$_3$)$_3$, and the like. Specific examples of the alkoxy group represented by R$_4$ and R$_5$ in the formula (3-5) include —OCH$_3$, —OCH$_2$CH$_3$, —OCH$_2$CH$_2$CH$_3$, —OCH(CH$_3$)$_2$, —OCH$_2$CH$_2$CH$_2$CH$_3$, —OCH$_2$CH(CH$_3$)$_2$, —OCH(CH$_3$)(CH$_2$CH$_3$), —OC(CH$_3$)$_3$, and the like.

The structural units shown by the following formulas (3-5-1) to (3-5-6) are particularly preferable as the structural unit shown by the formula (3-5).

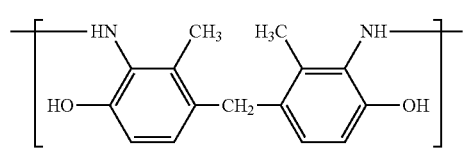

(3-5-1)

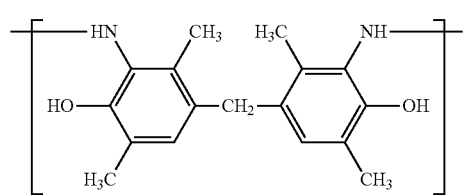

(3-5-2)

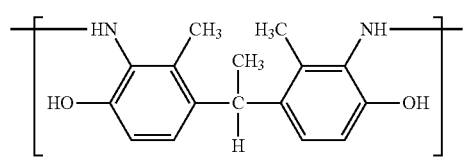

(3-5-3)

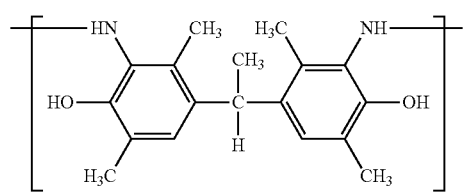

(3-5-4)

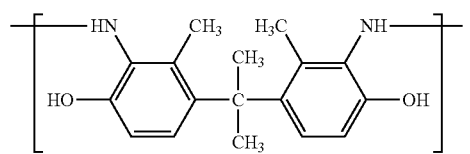

(3-5-5)

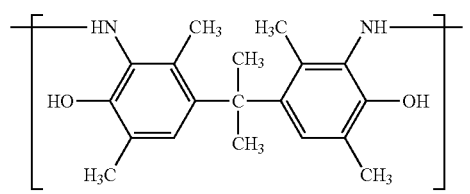

(3-5-6)

A polybenzoxazole precursor resin in which structural units shown by the following general formulas (5-1) and (5-2) (i.e., structural units derived from the diamine component) and a structural unit shown by the following general formula (5-3) (i.e., structural unit derived from the carboxylic acid component) are randomly copolymerized via an amide bond (hereinafter may be referred to as "polybenzoxazole precursor resin in which the structural units shown by the general formulas (5-1), (5-2), and (5-3) are randomly copolymerized") is preferable as the polybenzoxazole precursor resin (A).

(5-1)

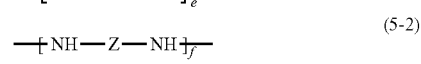

(5-2)

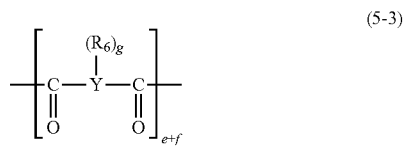

(5-3)

A polybenzoxazole precursor resin in which a structural unit shown by the following general formula (5-4) (i.e., structural unit derived from the diamine component) and a structural unit shown by the following general formula (5-5) (i.e., structural unit derived from the carboxylic acid component) are randomly copolymerized via an amide bond (hereinafter may be referred to as "polybenzoxazole precursor resin in which the structural units shown by the general formulas (5-4) and (5-5) are randomly copolymerized") is particularly preferable as the polybenzoxazole precursor resin (A).

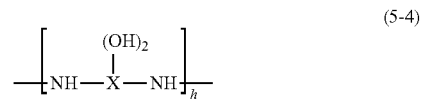

(5-4)

(5-5)

The polybenzoxazole precursor resin in which the structural units shown by the general formulas (5-1), (5-2), and (5-3) are randomly copolymerized may include only one type of the structural unit shown by the general formula (5-1), or may include two or more types of the structural unit shown by the general formula (5-1). Specifically, the diamine components corresponding to the general formula (5-1) may be diamine components that are identical in X, or may be diamine components that differ in X. The polybenzoxazole precursor resin in which the structural units shown by the general formulas (5-1), (5-2), and (5-3) are randomly copolymerized may include only one type of the structural unit shown by the general formula (5-2), or may include two or more types of the structural unit shown by the general formula (5-2). Specifically, the diamine components corresponding to the general formula (5-2) may be diamine components that are identical in Z, or may be diamine components that differ in Z. The polybenzoxazole precursor resin in which the structural units shown by the general formulas (5-1), (5-2), and (5-3) are randomly copolymerized may include only one type of the structural unit shown by the general formula (5-3), or may include two or more types of the structural unit shown by the general formula (5-3). Specifically, the carboxylic acid components corresponding to the general formula (5-3) may be carboxylic acid components that are identical in R$_6$, g, and Y, or may be carboxylic acid components that differ in $R_6$, g, and Y. Note that e and f in the general formulas (5-1), (5-2), and (5-3) merely indicate the number of structural units included in the resin (i.e., the respective components are not necessarily successively linked). The polybenzoxazole precursor resin in which the structural units shown by the general formulas (5-4) and (5-5) are randomly copolymerized may include only one type of the structural unit shown by the general formula (5-4), or may include two or more types of the structural unit shown by the general formula (5-4). Specifically, the diamine components corresponding to the general formula (5-4) may be diamine components that are identical in X, or may be diamine components that differ in X. The polybenzoxazole precursor resin in which the structural units shown by the general formulas (5-4) and (5-5) are randomly copolymerized may include only one type of the structural unit shown by the general formula (5-5), or may include two or more types of the structural unit shown by the general formula (5-5). Specifically, the carboxylic acid components corresponding to the general formula (5-5) may be carboxylic acid components that are identical in Y, or may be carboxylic acid components that differ in Y. Note that h in the general formulas (5-4) and (5-5) merely indicates the number of structural units included in the resin (i.e., the respective components are not necessarily successively linked). The polybenzoxazole precursor resin in which the structural units shown by the general formulas (5-1), (5-2), and (5-3) are randomly copolymerized and the polybenzoxazole precursor resin in which the structural units shown by the general formulas (5-4) and (5-5) are randomly copolymerized include a polybenzoxazole precursor resin that includes a benzoxazole structure obtained by cyclization of the benzoxazole precursor structure.

X, Y, and Z in the general formulas (5-1) to (5-5) represent an organic group. e, f, and h in the general formulas (5-1) to (5-5) indicate the number of structural units included in the resin, and are integers equal to or larger than 1. In the polybenzoxazole precursor resin in which the structural units shown by the general formulas (5-1), (5-2), and (5-3) are randomly copolymerized, the content (mol %) of the structural unit shown by the general formula (5-1) (i.e., $\{e/(e+f)\} \times 100(\%)$) in the diamine component is 30 to 100%, and the content (mol %) of the structural unit shown by the general formula (5-2) (i.e., $\{e/(e+f)\} \times 100(\%)$) in the diamine component is 0 to 70%. $R_6$ represents a hydroxyl group, a carboxyl group, —O—$R_7$, or —COO—$R_7$. A plurality of $R_6$ may be either the same or different when a plurality of $R_6$ are present. g is an integer from 0 to 4. $R_7$ represents an organic group having 1 to 15 carbon atoms. —O—$R_7$ and —COO—$R_7$ are groups in which a hydroxyl group or a carboxyl group is protected by $R_7$ that represents an organic group having 1 to 15 carbon atoms in order to adjust the solubility of the hydroxyl group or the carboxyl group in an alkaline aqueous solution. Examples of the organic group represented by $R_7$ include a formyl group, a methyl group, an ethyl group, a propyl group, an isopropyl group, a t-butyl group, a t-butoxycarbonyl group, a phenyl group, a benzyl group, a tetrahydrofuranyl group, a tetrahydropyranyl group, and the like.

X in the general formulas (5-1) and (5-4) represents an organic group. Examples of the organic group represented by X include the groups shown by the following formulas (6-1) to (6-6).

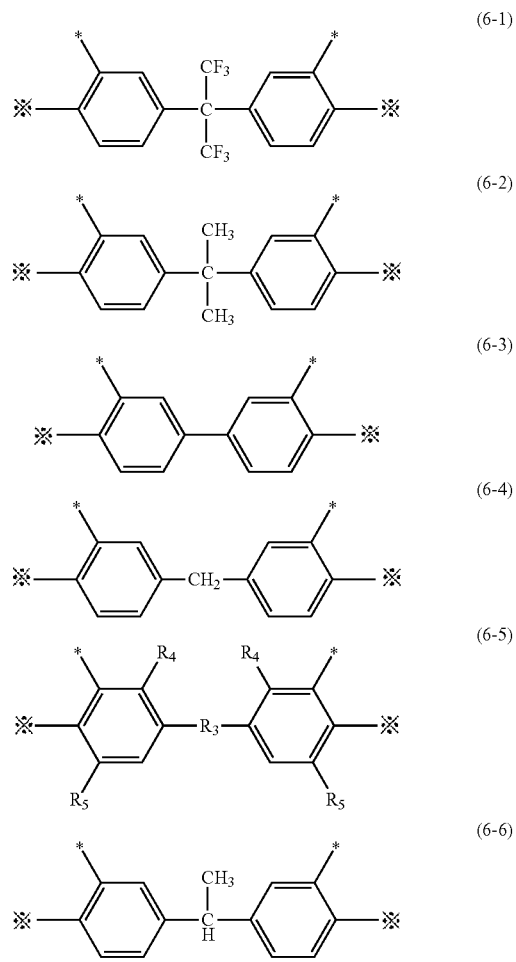

wherein "*" indicates a bonding site bonded to the NH group, "※" indicates a bonding site bonded to OH, and $R_3$ and $R_4$ are the same as defined above.

The groups shown by the following formulas (6-5-1) to (6-5-6) are preferable as the group shown by the formula (6-5).

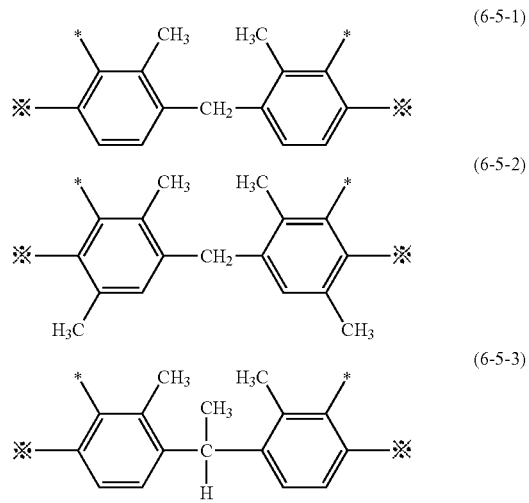

-continued

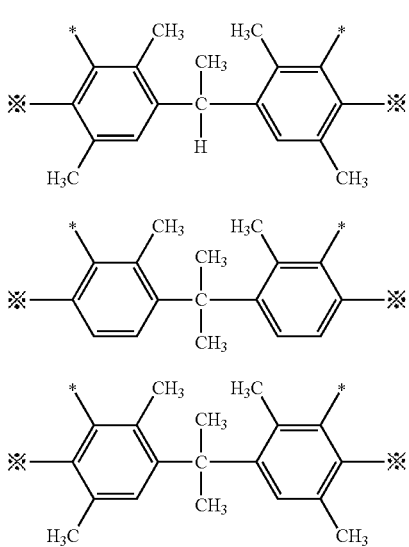

(6-5-4)

(6-5-5)

(6-5-6)

wherein "*" indicates a bonding site bonded to the NH group, and "✕" indicates a bonding site bonded to OH.

Z in the formula (5-2) represents an organic group. Examples of the organic group represented by Z include an aromatic ring (e.g., benzene ring and naphthalene ring), a bisphenol skeleton, a heterocyclic skeleton (e.g., pyrrole skeleton and furan skeleton), a siloxane skeleton, and the like. Specific examples of the organic group represented by Z include groups shown by the following formula (7).

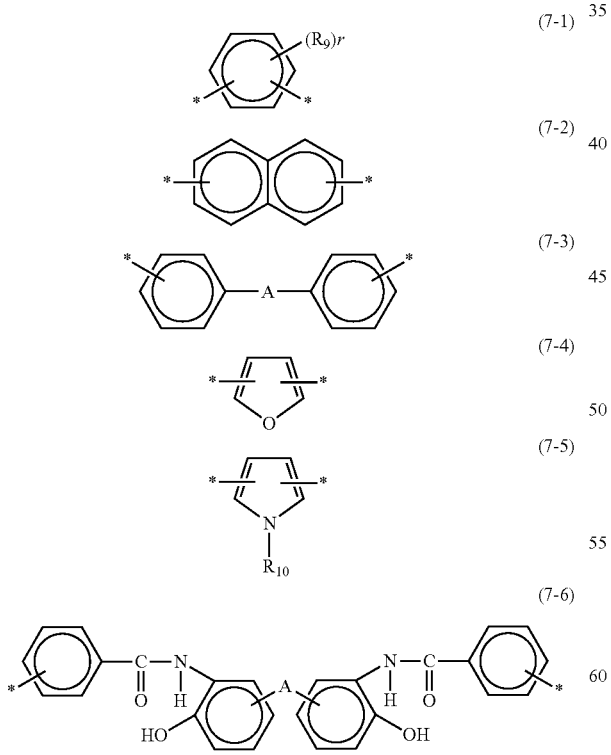

(7-1)

(7-2)

(7-3)

(7-4)

(7-5)

(7-6)

wherein "*" indicates a bonding site bonded to the NH group, A represents —CH$_2$—, —C(CH$_3$)$_2$—, —O—, —S—, —SO$_2$—, —CO—, —NHCO—, —C(CF$_3$)$_2$—, or a single bond, $R_9$ represents an alkyl group, an alkyl ester group, or a halogen atom, provided that a plurality of $R_9$ may be either the same or different when a plurality of $R_9$ are present, $R_{10}$ represents a hydrogen atom, an alkyl group, an alkyl ester group, or a halogen atom, and r is an integer from 0 to 2,

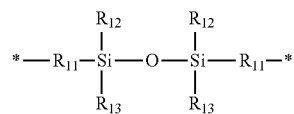

(7)

(7-7)

wherein "*" indicates a bonding site bonded to the NH group, and $R_{11}$ to $R_{13}$ represent an organic group.

Examples of a preferable group shown by the formula (7) include the groups shown by the following formulas (8) and (9).

(8)

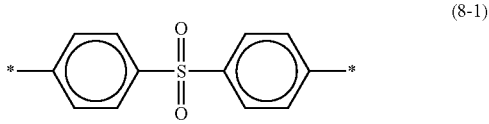

(8-1)

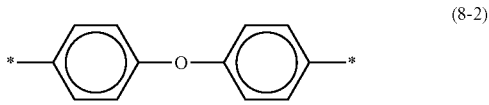

(8-2)

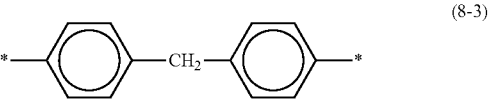

(8-3)

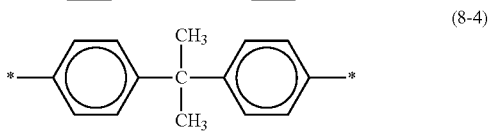

(8-4)

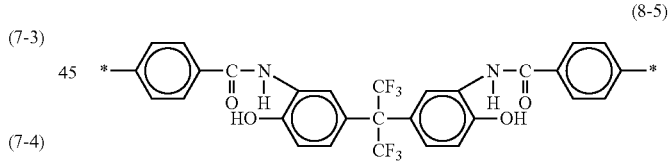

(8-5)

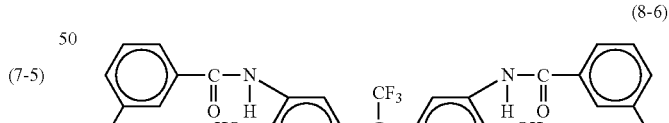

(8-6)

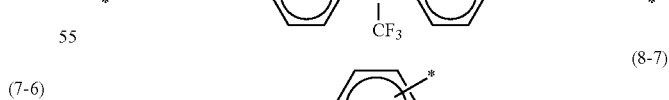

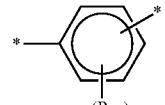

(8-7)

wherein "*" indicates a bonding site bonded to the NH group, $R_{14}$ represents an alkyl group, an alkyl ester group, or a halogen atom, provided that a plurality of $R_{14}$ may be either the same or different when a plurality of $R_{14}$ are present, and s is an integer from 0 to 2.

(9)

(9-1)
$*-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_3-*$ (9-2)
[structure: *–C6H4–Si(CH3)2–O–Si(CH3)2–C6H4–*]

(9-3)
[structure: *–C6H4–(CH2)2–Si(CH3)2–O–Si(CH3)2–(CH2)2–C6H4–*]

(9-4)
[structure: HO–C6H3(*)–Si(CH3)2–O–Si(CH3)2–C6H3(*)–OH]

wherein "*" indicates a bonding site bonded to the NH group.

Y in the formulas (5-3) and (5-5) represents an organic group. Examples of the organic group represented by Y include an aromatic ring (e.g., benzene ring and naphthalene ring), a bisphenol skeleton, a heterocyclic skeleton (e.g., pyrrole skeleton, pyridine skeleton, and furan skeleton), a siloxane skeleton, and the like. Specific examples of the organic group represented by Y include the groups shown by the following formula (10).

(10-1) [benzene ring with $(R_{15})_t$ substituents and two * positions]

(10-2) [naphthalene with two *]

(10-3) [two phenyl rings connected by A, with two *]

(10-4) [furan with two *]

(10-5) [pyrrole with N–$R_{16}$ and two *]

(10-6) [pyridine with two *]

(10-7) [structure: *–C6H4–C(=O)–NH–C6H3(OH)–A–C6H3(OH)–NH–C(=O)–C6H4–*]

wherein "*" indicates a bonding site bonded to the C=O group, A represents —$CH_2$—, —$C(CH_3)_2$—, —O—, —S—, —$SO_2$—, —CO—, —NHCO—, —$C(CF_3)_2$—, or a single bond, $R_{15}$ represents an alkyl group, an alkyl ester group, an alkyl ether group, a benzyl ether group, or a halogen atom, provided that a plurality of $R_{15}$ may be either the same or different when a plurality of $R_{15}$ are present, $R_{16}$ represents a hydrogen atom, an alkyl group, an alkyl ester group, or a halogen atom, and t is an integer from 0 to 2, (10)

(10-8)
$*-R_{17}-\underset{\underset{R_{20}}{|}}{\overset{\overset{R_{19}}{|}}{Si}}-O-\underset{\underset{R_{20}}{|}}{\overset{\overset{R_{19}}{|}}{Si}}-R_{18}-*$ wherein "*" indicates a bonding site bonded to the C=O group, and $R_{17}$ to $R_{20}$ represent an organic group.

In the formula (5-3), the number of $R_6$ bonded to Y is 0 to 4 ($R_6$ is omitted in the formula (10)).

Examples of a preferable group shown by the formula (10) include the groups shown by the following formula (11). In the formula (11), the structure derived from a tetracarboxylic dianhydride is bonded to the C=O group at only the meta position or only the para position. Note that the structure derived from a tetracarboxylic dianhydride may be bonded to the C=O group at both of the meta position and the para position.

(11-1) [*–C6H4–O–C6H4–*]

(11-2) [benzene with two * and $(R_{21})_u$ substituents]

(11-3) [*–C6H4–SO2–C6H4–*]

(11-4) [*–C6H4–C(=O)–C6H4–*]

(11-5) [benzene with * and –C(=O)–O–$R_{22}$]

-continued (11-6)
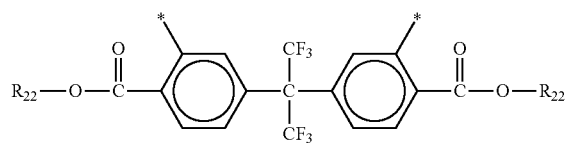

(11-7)
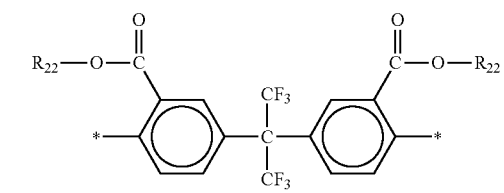

(11-8)
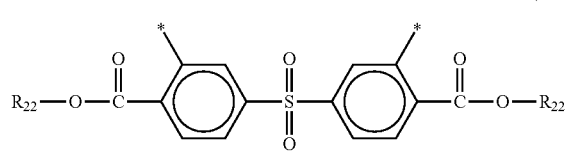

(11-9)
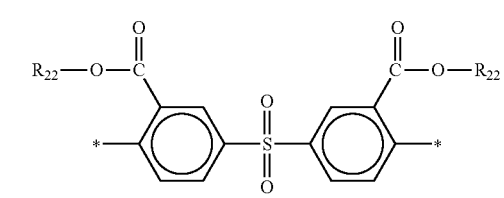

(11-10)
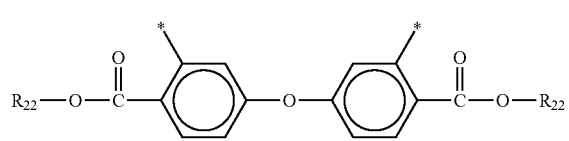

(11-11)
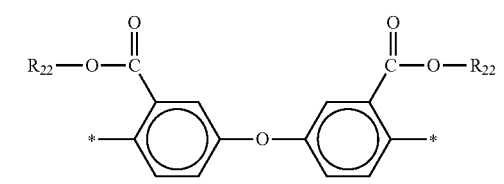

(11-12)
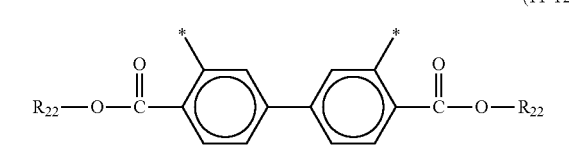

(11-13)
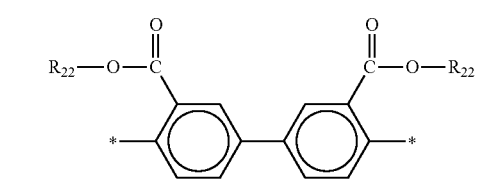

(11-14)
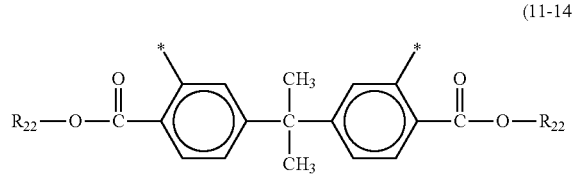

-continued (11-15)
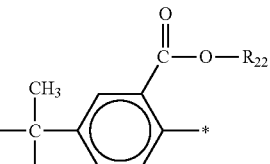

(11-16)
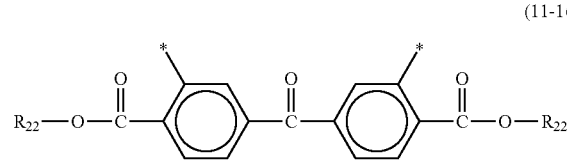

(11-17)

(11-18)
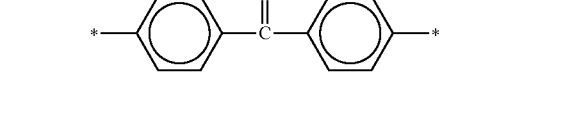

(11-19)
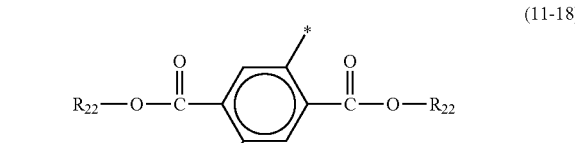

(11-20)
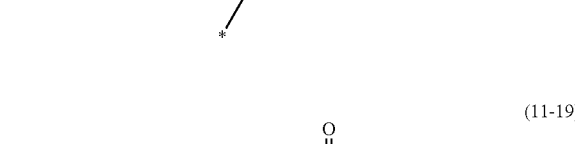

(11-21)
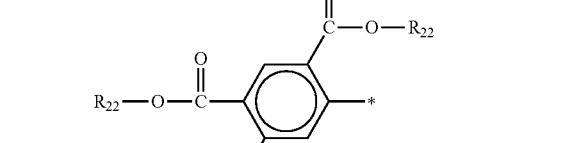

wherein "*" indicates a bonding site bonded to the C=O group, $R_{21}$ represents an alkyl group, an alkyl ester group, an alkyl ether group, a benzyl ether group, or a halogen atom, provided that a plurality of $R_{21}$ may be either the same or different when a plurality of $R_{21}$ are present, $R_{22}$ represents a hydrogen atom or an organic group having 1 to 15 carbon atoms, and u is an integer from 0 to 2.

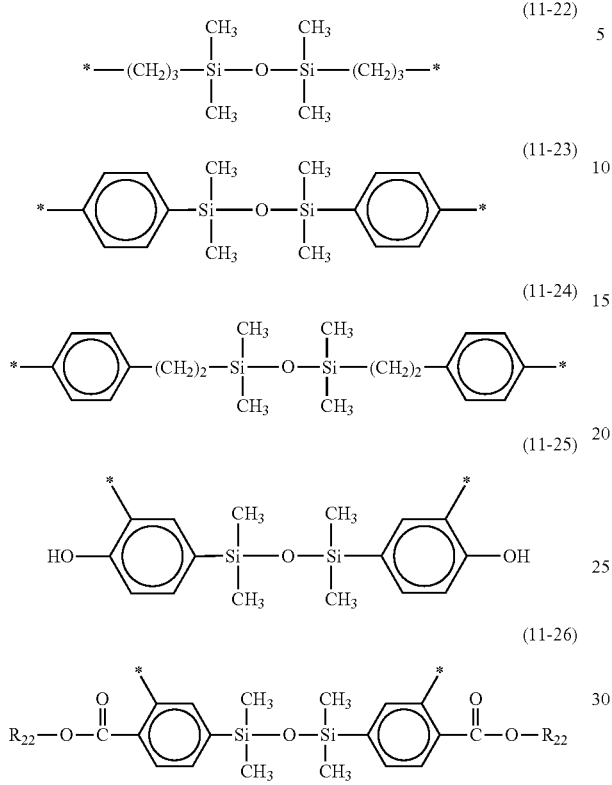

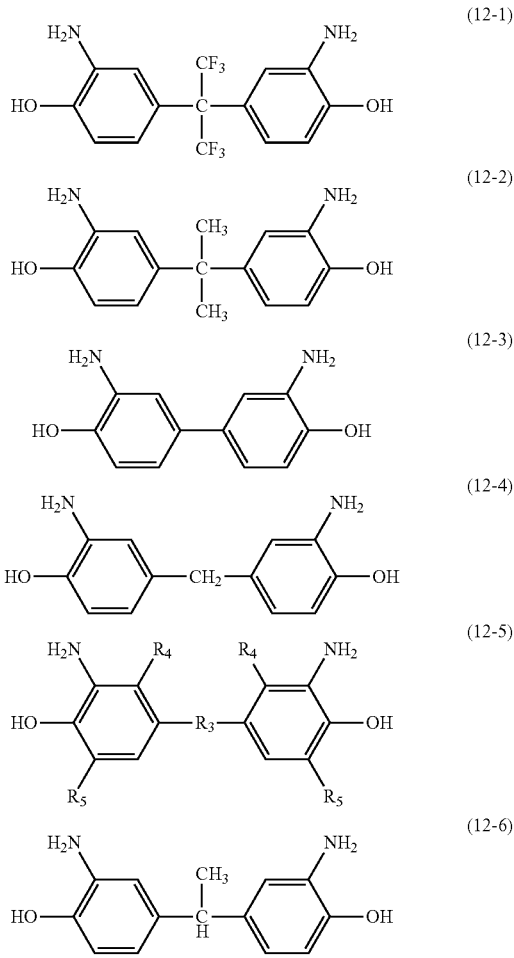

wherein "*" indicates a bonding site bonded to the C=O group, and $R_{22}$ represents a hydrogen atom or an organic group having 1 to 15 carbon atoms.

The polybenzoxazole precursor resin in which the structural units shown by the general formulas (5-1), (5-2), and (5-3) are randomly copolymerized may be obtained by reacting at least one bis(aminophenol) selected from the compounds shown by the following formulas (12-1) to (12-6), or a diamine that includes at least one bis(aminophenol) selected from the compounds shown by the following formulas (12-1) to (12-6) and the organic group represented by Z, with a compound selected from a tetracarboxylic dianhydride, trimellitic anhydride, a dicarboxylic acid, a dicarboxylic acid dichloride, a dicarboxylic acid derivative, a hydroxydicarboxylic acid, a hydroxydicarboxylic acid derivative, and the like that include the organic group represented by Y.

The polybenzoxazole precursor resin in which the structural units shown by the general formulas (5-4) and (5-5) are randomly copolymerized may be obtained by reacting at least one bis(aminophenol) selected from the compounds shown by the following formulas (12-1) to (12-6) with a compound selected from a dicarboxylic acid, a dicarboxylic acid dichloride, a dicarboxylic acid derivative, and the like that include the organic group represented by Y. Note that an active ester-type dicarboxylic acid derivative obtained by reacting a dicarboxylic acid with 1-hydroxy-1,2,3-benzotriazole or the like may be used in order to improve the reaction yield and the like.

wherein $R_3$, $R_4$, and $R_5$ are the same as defined above.

Specific examples of the bis(aminophenol) shown by the formula (12-5) include, but are not limited to, the compounds shown by the following formulas (12-5-1) to (12-5-6). These compounds may be used either individually or in combination.

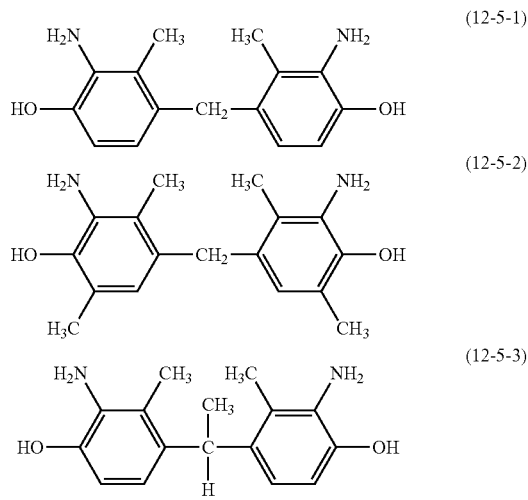

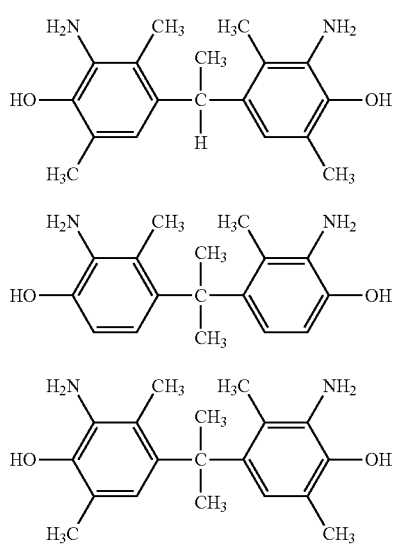

(12-5-4)

(12-5-5)

(12-5-6)

It is preferable that the polybenzoxazole precursor resin in which the structural units shown by the general formulas (5-1), (5-2), and (5-3) are randomly copolymerized and the polybenzoxazole precursor resin in which the structural units shown by the general formulas (5-4) and (5-5) are randomly copolymerized be a polybenzoxazole precursor resin in which the end amino group is capped as an amide using an acid anhydride that includes an aliphatic group or a cyclic compound group that includes at least one alkenyl group or alkynyl group. This makes it possible to improve the storage stability of the polybenzoxazole precursor resin.

Examples of a group derived from an acid anhydride that includes an aliphatic group or a cyclic compound group that includes at least one alkenyl group or alkynyl group obtained via a reaction with the amino group include the groups shown by the following formulas (13) and (14). These groups may be used either individually or in combination.

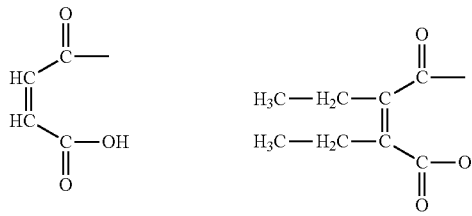

(13)

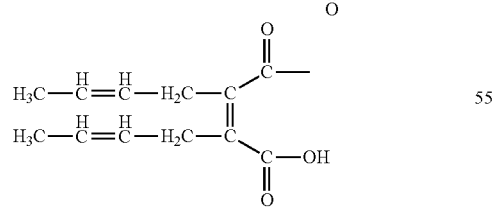

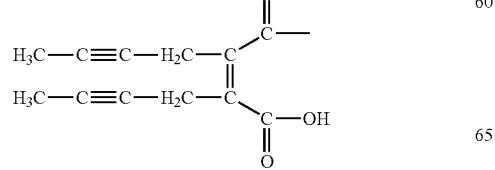

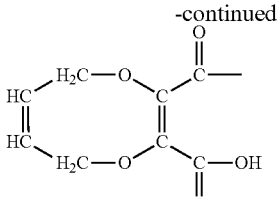

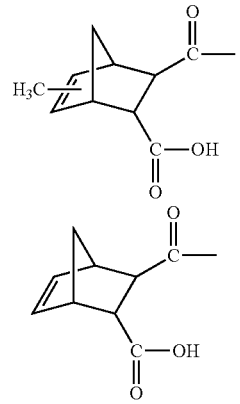

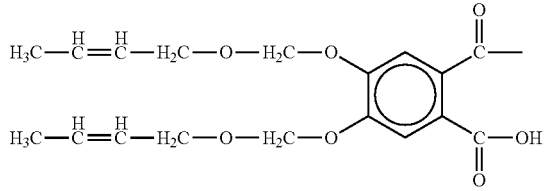

(14)

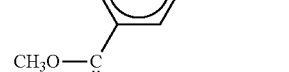

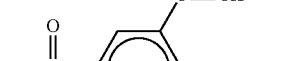

-continued

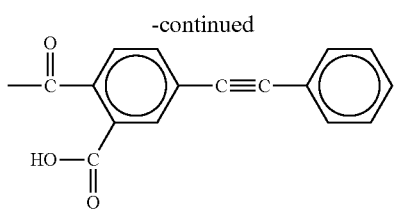

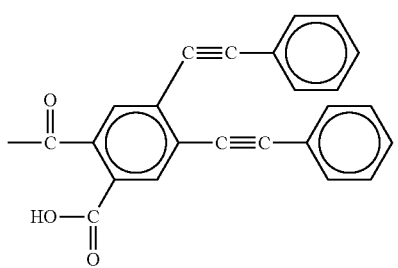

Among these, the groups shown by the following formula (15) are particularly preferable. The storage stability of the polybenzoxazole precursor resin can be improved by utilizing these groups.

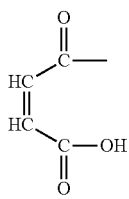
(15)

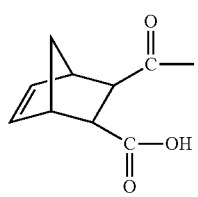

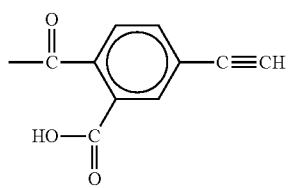

Note that the end acid of the of the polybenzoxazole precursor resin (A) may be capped as an amide using an amine derivative that includes an aliphatic group or a cyclic compound group that includes at least one alkenyl group or alkynyl group.

At least one of the side chain and the other end of the polybenzoxazole precursor resin (A) may include a group having a nitrogen-containing cyclic structure. This makes it possible to improve adhesion to a metal wire (particularly a copper wire) or the like. Specifically, when the polybenzoxazole precursor resin (A) includes an organic group including an unsaturated group at one end, the resulting cured film exhibits excellent mechanical properties (e.g., tensile elongation) due to a reaction of the resin. When at least one of the side chain and the other end of the polybenzoxazole precursor resin (A) includes a group having a nitrogen-containing cyclic structure, the group having a nitrogen-containing cyclic structure reacts with a metal wire (e.g., copper wire or copper alloy wire), so that adhesion to the metal wire is improved.

Examples of the group having a nitrogen-containing cyclic structure include 1-(5-1H-triazoyl)methylamino group, 3-(1H-pyrazoyl)amino group, 4-(1H-pyrazoyl)amino group, 5-(1H-pyrazoyl)amino group, 1-(3-1H-pyrazoyl)methylamino group, 1-(4-1H-pyrazoyl)methylamino group, 1-(5-1H-pyrazoyl)methylamino group, (1H-tetrazol-5-yl)amino group, 1-(1H-tetrazol-5-yl)methylamino group, 3-(1H-tetrazol-5-yl)benzamino group, and the like.

The number average molecular weight (Mn) of the polybenzoxazole precursor resin (A) is preferably 5000 to 40,000, and particularly preferably 6000 to 20000.

The term "number average molecular weight (Mn)" used herein refers to a standard polystyrene-reduced value determined by gel permeation chromatography (GPC).

The polybenzoxazole precursor resin (A) has a dissolution rate in a 2.38% tetramethylammonium hydroxide aqueous solution of 10 to 300 nm/sec. If the polybenzoxazole precursor resin (A) has a dissolution rate in a 2.38% tetramethylammonium hydroxide aqueous solution of 10 nm/sec or more, the resin (scum) rarely remains in the exposed area after development due to excellent solubility in the developer. If the polybenzoxazole precursor resin (A) has a dissolution rate in a 2.38% tetramethylammonium hydroxide aqueous solution of 300 nm/sec or less, in-plane thickness uniformity after development is improved due to moderate solubility in the developer.

The photosensitive diazoquinone compound (B) may be a compound having a 1,2-naphthoquinone-2-diazido structure or a compound having a 1,2-benzoquinone-2-diazido structure.

Examples of the photosensitive diazoquinone compound (B) include esters of a phenol compound and 1,2-naphthoquinone-2-diazido-5-sulfonic acid or 1,2-naphthoquinone-2-diazido-4-sulfonic acid. Specific examples of the photosensitive diazoquinone compound (B) include ester compounds shown by the following formulas (16) to (19). These compounds may be used either individually or in combination.

(16)
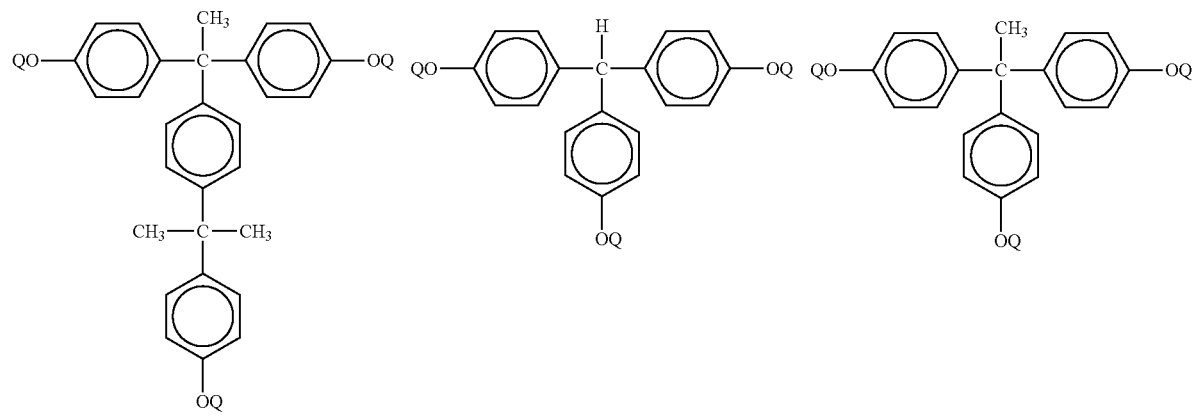
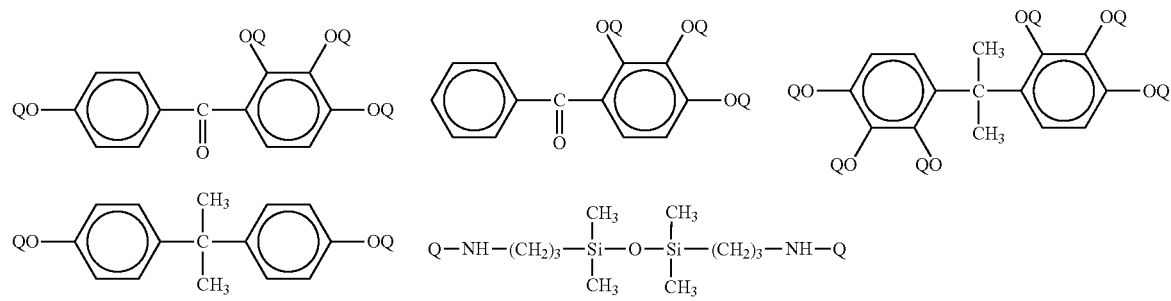
(17)
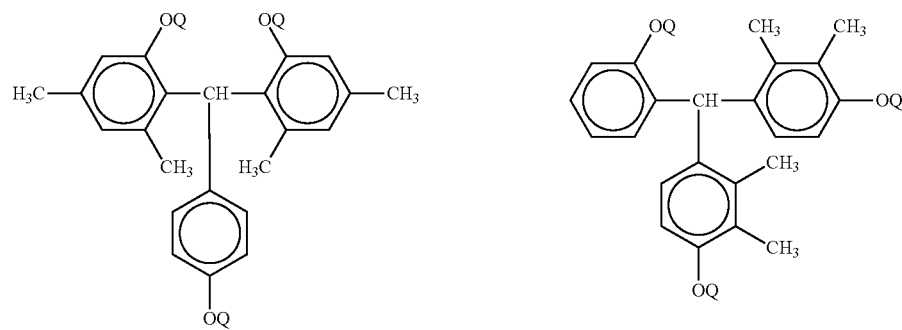
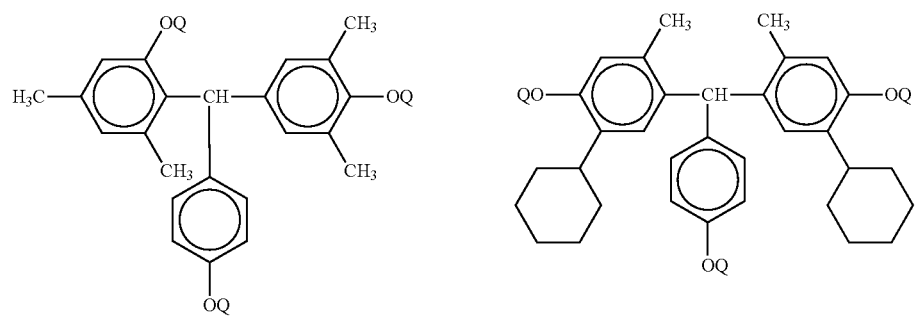
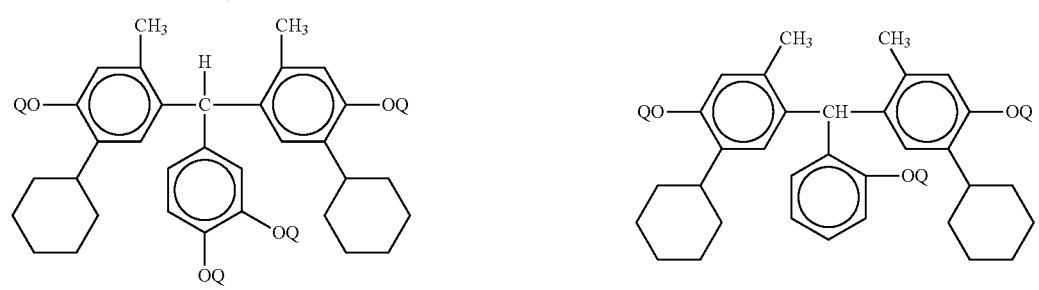

-continued
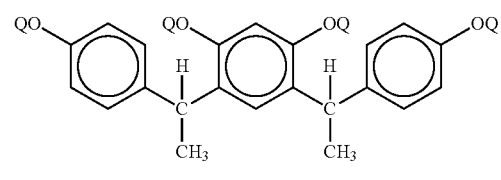
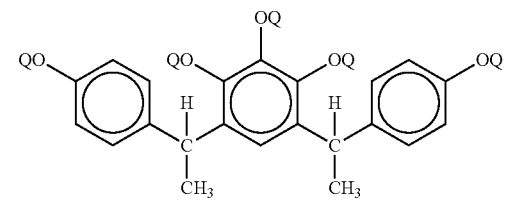
(18)
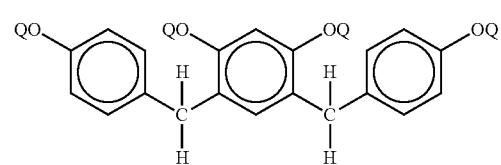
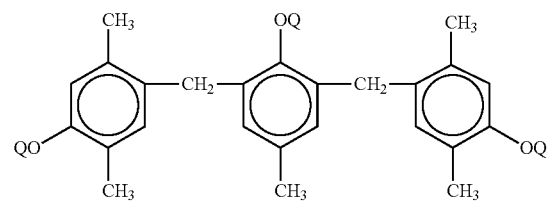
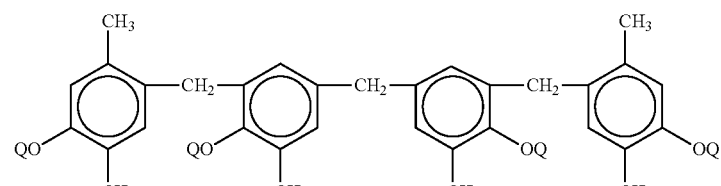
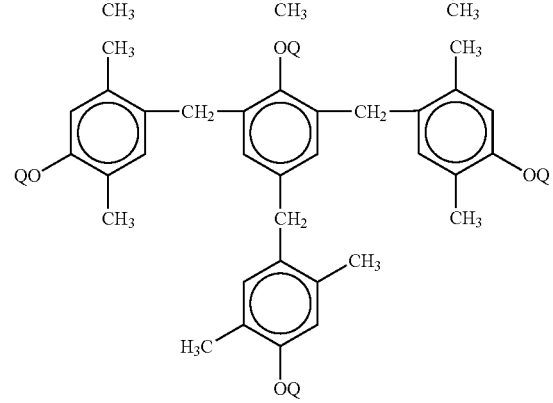
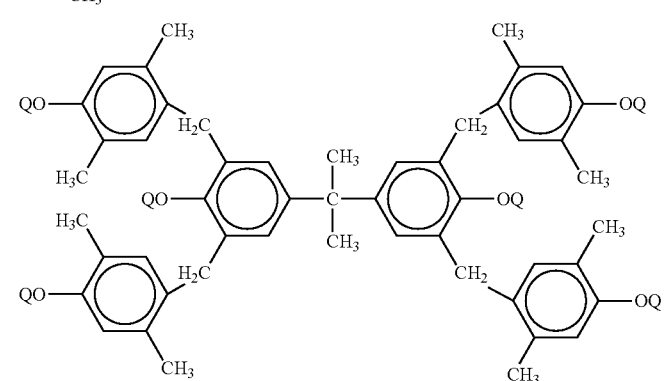
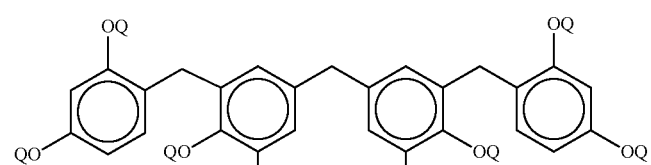
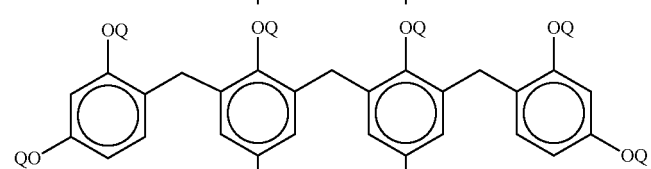
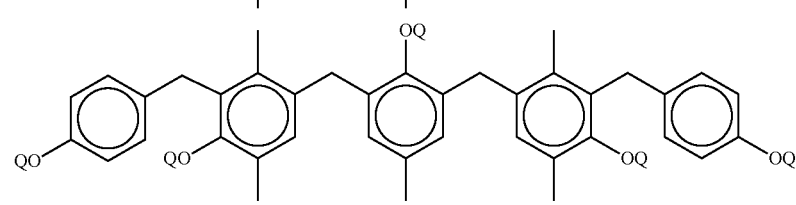
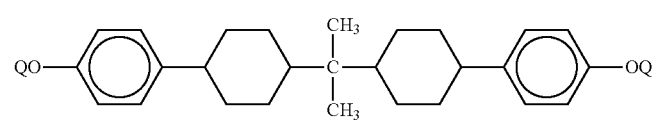
(19)

-continued
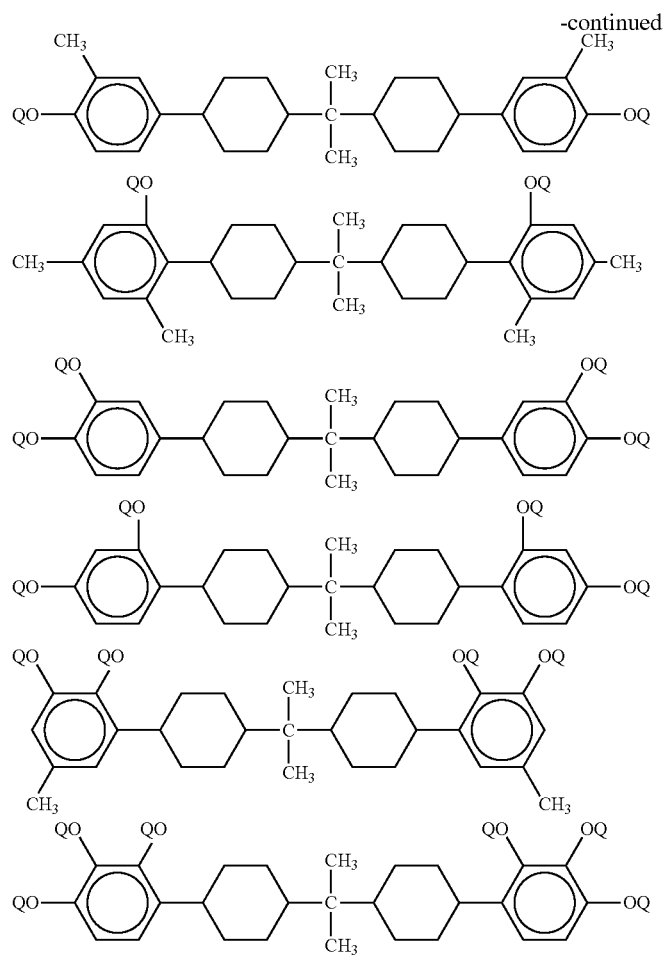
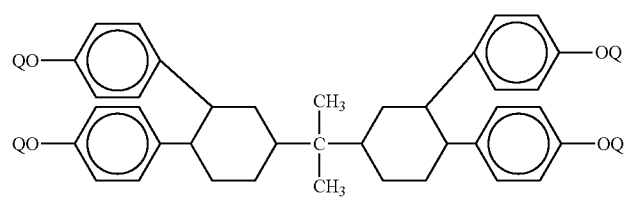
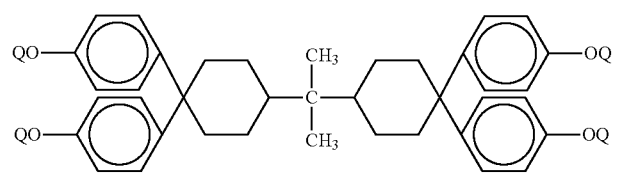
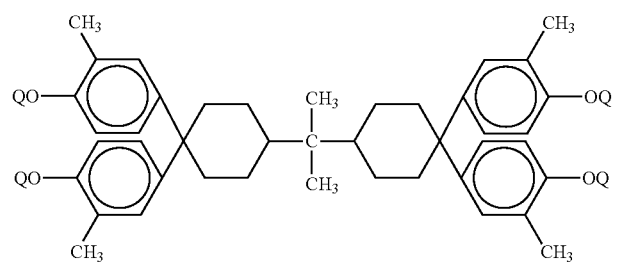

wherein Q represents a hydrogen atom, the group shown by the following formula (20), or the group shown by the following formula (21), provided that at least one Q of each compound represents the group shown by the following formula (20) or the group shown by the following formula (21).

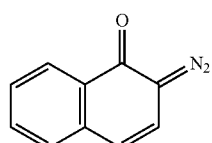

(20)

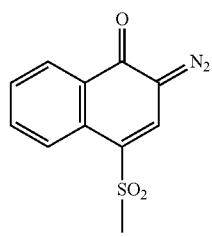

(21)

The photosensitive diazoquinone compound (B) is preferably used in the positive photosensitive resin composition according to one embodiment of the invention in an amount of 1 to 50 parts by mass, and particularly preferably 10 to 40 parts by mass, based on 100 parts by mass of the polybenzoxazole precursor resin (A). If the amount of the photosensitive diazoquinone compound (B) is 1 parts by mass or more, the patterning capability is improved due to an increase in solubility of the exposed area in an alkaline aqueous solution, and the resolution and the sensitivity are also improved. If the amount of the photosensitive diazoquinone compound (B) is 50 parts by mass or less, a scum and a decrease in transparency of the film due to the photosensitizer is moderately suppressed, so that high sensitivity and high resolution are obtained.

The positive photosensitive resin composition according to one embodiment of the invention includes the hindered phenol antioxidant (C) shown by the general formula (1).

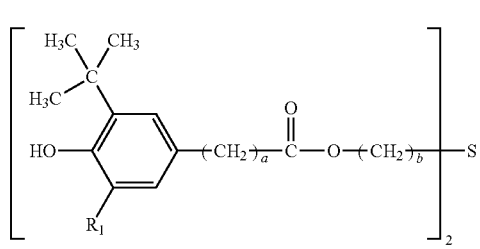

(1)

wherein $R_1$ represents a hydrogen atom or an alkyl group having 1 to 4 carbon atoms, a is an integer from 1 to 3, and b is an integer from 1 to 3.

Specific examples of the hindered phenol antioxidant (C) shown by the general formula (1) include thiodimethylenebis[3-(3-tert-butyl-4-hydroxyphenyl)propionate], thiodimethylenebis[3-(3-methyl-5-tert-butyl-4-hydroxyphenyl)propionate], thiodimethylenebis[3-(3,5-di-tert-butyl-4-hydroxyphenyl)propionate], thiodiethylenebis[3-(3-tert-butyl-4-hydroxyphenyl)propionate], thiodiethylenebis[3-(3-methyl-5-tert-butyl-4-hydroxyphenyl)propionate], thiodiethylenebis[3-(3,5-di-tert-butyl-4-hydroxyphenyl)propionate], thiodipropylenebis[3-(3-tert-butyl-4-hydroxyphenyl)propionate], thiodipropylenebis[3-(3-methyl-5-tert-butyl-4-hydroxyphenyl)propionate], thiodipropylenebis[3-(3,5-di-tert-butyl-4-hydroxyphenyl)propionate], and the like. These compounds may be used either individually or in combination.

The hindered phenol antioxidant (C) shown by the general formula (1) is preferably used in the positive photosensitive resin composition according to one embodiment of the invention in an amount of 0.1 to 20 parts by mass, and particularly preferably 1 to 10 parts by mass, based on 100 parts by mass of the polybenzoxazole precursor resin (A). If the amount of the hindered phenol antioxidant (C) is 0.1 parts by mass or more, the discoloration resistance during curing or heating after curing and adhesion to the substrate are improved. If the amount of the hindered phenol antioxidant (C) is 20 parts by mass or less, the sensitivity is improved.

The positive photosensitive resin composition according to one embodiment of the invention includes the phenol compound (D) shown by the general formula (2).

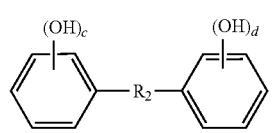

(2)

wherein $R_2$ represents a methylene group or a single bond, c is an integer from 1 to 3, and d is an integer from 1 to 3.

Specific examples of the phenol compound (D) shown by the general formula (2) include the compounds shown by the following formulas (4-1) and (4-2).

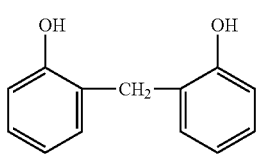

(4-1)

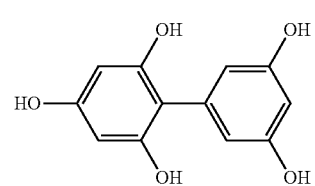

(4-2)

The phenol compound (D) shown by the general formula (2) is preferably used in the positive photosensitive resin composition according to one embodiment of the invention in an amount of 1 to 30 parts by mass, and particularly preferably 1 to 20 parts by mass, based on 100 parts by mass of the polybenzoxazole precursor resin (A). If the amount of the phenol compound (D) is 1 part by mass or more, the sensitivity during development is improved. If the amount of the phenol compound (D) is 30 parts by mass or less, precipitation or the like rarely occurs during frozen storage (i.e., the storage stability is improved).

The mass ratio ((D)/(C)) of the content of the phenol compound (D) shown by the general formula (2) to the content of the hindered phenol antioxidant (C) shown by the general formula (1) is preferably 1 to 50, more preferably 1 to 30, and particularly preferably 1 to 20. If the mass ratio of the content of the phenol compound (D) shown by the general formula (2) to the content of the hindered phenol antioxidant (C) shown by the general formula (1) is within the above range, adhesion is improved.

It is considered that a hydroxyl group is formed on the surface of a substrate (e.g., silicon wafer) used for a semiconductor production process due to adsorbed water. It is conjectured that a silane coupling agent having an alkoxysilane structure exhibits adhesion via formation of a covalent bond with the hydroxyl group formed on the surface of the substrate, and a substance that includes a hydroxyl group interacts with the hydroxyl group formed on the surface of the substrate via formation of a hydrogen bond.

It is conjectured that the phenol compound (D) interacts with the hydroxyl group formed on the surface of the substrate via formation of a hydrogen bond. When even a small amount of oxygen is present during heating for producing a cured film, the phenol structure is oxidized to form a quinone structure, and the interaction decreases. However, since the hindered phenol antioxidant (C) is used, oxidation of the phenol compound (D) is prevented, so that the amount of the phenol compound (D) that interacts with the surface of the substrate increases.

Since the hindered phenol antioxidant (C) shown by the general formula (1) has an ester structure (polar group), exhibits flexibility, and has a thioether structure that is easily oxidized to form a sulfoxide structure or a sulfone structure having high polarity, it is considered that the hindered phenol antioxidant (C) exhibits high mutual solubility with the polybenzoxazole precursor resin (A), and effectively prevents oxidation of the hydroxyl group included in the polybenzoxazole precursor resin (A).

The hindered phenol antioxidant (C) shown by the general formula (1) thus prevents oxidation of the hydroxyl group included in the phenol compound (D) and the hydroxyl group included in the polybenzoxazole precursor resin (A).

A linear polymer is present in a solution in the shape of a ball, and it is considered that the polybenzoxazole precursor resin (A) is present in a varnish solution in a similar state. Since the polybenzoxazole precursor resin (A) includes a hydroxyl group (i.e., polar group), it is considered that part of the polybenzoxazole precursor resin (A) forms an intramolecular hydrogen bond in addition to an intermolecular hydrogen bond. It is conjectured that the phenol compound (D) having a low molecular weight forms a hydrogen bond with the hydroxyl group of the polybenzoxazole precursor resin (A) that is involved in formation of the intermolecular hydrogen bond and the intramolecular hydrogen bond.

Therefore, the phenol compound (D) that is prevented from being oxidized mediates between the polybenzoxazole precursor resin (A) and the surface of the substrate via a hydrogen bond, and the number of hydrogen bonds increases. The polybenzoxazole precursor resin (A) is dehydrated and cyclized upon curing to form a polybenzoxazole resin. It is conjectured that part of the oxazole precursor structure and some of the hydrogen bonds remain after curing, so that adhesion is further improved.

The positive photosensitive resin composition according to one embodiment of the invention may optionally include an additive (e.g., leveling agent or silane coupling agent).

The positive photosensitive resin composition according to one embodiment of the invention is used in the form of a varnish in which the polybenzoxazole precursor resin (A), the photosensitive diazoquinone compound (B), the hindered phenol antioxidant (C) shown by the following general formula (1), the phenol compound (D) shown by the following general formula (2), and an optional additive are dissolved or dispersed in a solvent. Examples of the solvent include N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol 3-monomethyl ether, methyl pyruvate, ethyl pyruvate, methyl-3-methoxypropionate, and the like. These solvents may be used either individually or in combination.

A cured product of the positive photosensitive resin composition according to one embodiment of the invention exhibits improved adhesion to a substrate due to the hindered phenol antioxidant (C) shown by the general formula (1) and the phenol compound (D) shown by the general formula (2). The hindered phenol antioxidant (C) shown by the general formula (1) has a high oxidation preventive effect, so that the cured film has a light color, and is discolored to only a small extent due to heating. Since the phenol compound (D) shown by the general formula (2) (i.e., a phenol compound that has a low molecular weight and includes at least one hydroxyl group on the aromatic ring) promotes dissolution, the dissolution rate of the exposed area increases. Since no group is present at the ortho position and the para position with respect to the phenolic hydroxyl group having a high electron density, a coupling reaction with the azo group of the photosensitive diazoquinone compound (B) effectively occurs. Therefore, dissolution of the unexposed area is prevented, and the sensitivity and the resolution are significantly improved due to an increase in difference in solubility. Moreover, it is possible to reduce a film loss in the unexposed area that may occur when increasing the molecular weight of the polybenzoxazole precursor resin (A) in order to improve the sensitivity.

The positive photosensitive resin composition according to one embodiment of the invention thus makes it possible to (i) improve the sensitivity and the resolution, (ii) produce a cured film that has a light color and is discolored to only a small extent due to heating, and (iii) produce a cured film that exhibits improved adhesion to a substrate.

The positive photosensitive resin composition according to one embodiment of the invention is used as described below. Specifically, the positive photosensitive resin composition is applied to a silicon wafer, a silicon wafer on which a passivation layer (e.g., $SiO_2$ or $Si_3N_4$ film) is formed, a ceramic substrate, an aluminum substrate, or the like. When applying the positive photosensitive resin composition to a semiconductor element, the positive photosensitive resin composition is applied so that the resulting cured film has a thickness of 1.0 to 30 μm. If the thickness of the cured film is less than 0.1 μm, the cured film may not sufficiently function as a surface protective film for the semiconductor element. If the thickness of the cured film exceeds 30 μm, it may be difficult to obtain a fine pattern. Moreover, processing may take time, so that the throughput may decrease. The positive photosensitive resin composition may be applied by spin coating using a spinner, spray coating using a spray coater, dipping, printing, roll coating, or the like. The resulting film is prebaked (dried) at 60 to 130° C., and irradiated with actinic rays along a desired pattern shape. X-rays, electron beams, ultraviolet rays, visible rays, or the like may be used as the actinic rays. It is preferable to use actinic rays having a wavelength of 200 to 500 nm.

The irradiated area is dissolved and removed using a developer to obtain a relief pattern. Examples of the developer include an aqueous solution of an alkali such as an inorganic alkali (e.g., sodium hydroxide, potassium hydroxide, sodium carbonate, sodium silicate, sodium metasilicate, or aqueous ammonia), a primary amine (e.g., ethylamine or n-propylamine), a secondary amine (e.g., diethylamine or di-n-propylamine), a tertiary amine (e.g., triethylamine or methyldiethylamine) an alcohol amine (e.g., dimethylethanolamine or triethanolamine), or a quaternary ammonium salt (e.g., tetramethylammonium hydroxide or tetraethylammonium hydroxide), and an aqueous solution obtained by adding an appropriate amount of a water-soluble organic solvent such as an alcohol (e.g., methanol or ethanol) or a surfactant to the above aqueous solution. Examples of the development method include spray development, puddle development, immersion development, ultrasonic development, and the like.

The relief pattern formed by development is then rinsed. Distilled water is used as the rinse agent. The relief pattern is heated (cured) to form an oxazole ring or an oxazole ring and an imide ring. A pattern that exhibits excellent heat resistance is thus obtained. The relief pattern may be heated at a high temperature or a low temperature. When heating the relief pattern at a high temperature, the heating temperature is preferably 280 to 380° C., and more preferably 290 to 350° C. When heating the relief pattern at a low temperature, the heating temperature is preferably 150 to 280° C., and more preferably 180 to 260° C.

The positive photosensitive resin composition according to one embodiment of the invention may also be useful for forming an interlayer insulating film of a multilayered circuit, a cover coating of a flexible copper-clad board, a solder resist film, an interlayer insulating film for a display device, and the like in addition to semiconductor device applications.

Examples of the semiconductor device applications include a passivation layer obtained by forming a film of the positive photosensitive resin composition on a semiconductor element, a buffer coat layer obtained by forming a film of the positive photosensitive resin composition on a passivation layer formed on a semiconductor element, an interlayer insulating film obtained by forming a film of the positive photosensitive resin composition on a circuit formed on a semiconductor element, and the like.

Examples of the display device applications include a TFT interlayer insulating film, a TFT planarization film, a color filter planarization film, a protrusion for MVA liquid crystal displays, and a cathode partition for organic EL elements. In such a case, a patterned layer of the positive photosensitive resin composition is formed by the above method on a substrate on which a display element and a color filter are formed. High transparency is required for display device applications (particularly an interlayer insulating film or a planarization film). A resin layer that exhibits excellent transparency can be obtained by providing a post-exposure step before curing a layer of the positive photosensitive resin composition.

EXAMPLES

The invention is further described below by way of examples.

Example 1

(Synthesis of Polybenzoxazole Precursor Resin)

A four-necked separable flask equipped with a thermometer, a stirrer, a raw material inlet, and a dry nitrogen gas feed pipe was charged with 443.2 g (0.90 mol) of a dicarboxylic acid derivative obtained by reacting 1 mol of diphenyl ether-4,4'-dicarboxylic acid with 2 mol of 1-hydroxybenzotriazole, and 366.3 g (1.00 mol) of hexafluoro-2,2-bis(3-amino-4-hydroxyphenyl)propane. 3000 g of N-methyl-2-pyrrolidone was added to the flask to dissolve the components. The mixture was then reacted at 75° C. for 16 hours using an oil bath.

After the addition of 32.8 g (0.20 mol) of 5-norbornene-2,3-dicarboxylic anhydride dissolved in 100 g of N-methyl-2-pyrrolidone, and the mixture was stirred for 3 hours to complete the reaction. The reaction mixture was filtered, and poured into a water/isopropanol (=3/1) mixture. The resulting precipitate was collected by filtration, sufficiently washed with water, and dried under vacuum to obtain the target polybenzoxazole precursor resin (A-1) having a number average molecular weight of 12,000 in which the structural units shown by the general formulas (5-4) and (5-5) were randomly copolymerized.

(Measurement of Dissolution Rate)

4 g of the polybenzoxazole precursor resin (A-1) was dissolved in 14 g of N-methyl-2-pyrolidone, and the solution was filtered through a Teflon (registered trademark) filter (pore size: 0.2 μm) to obtain a polybenzoxazole precursor resin solution.

The polybenzoxazole precursor resin solution was applied to a 6-inch silicon wafer using a spin coater, and prebaked at 120° C. for 3 minutes using a hot plate to obtain a film having a thickness of 5 μm.

The silicon wafer was then immersed in a 2.38% tetramethylammonium hydroxide aqueous solution (23±0.2° C.) to measure the dissolution time required for the polybenzoxazole precursor resin on the silicon wafer to be completely dissolved. The dissolution rate was calculated by dividing the thickness of the film by the dissolution time. The dissolution rate thus calculated was 88 nm/sec.

(Synthesis of Photosensitive Diazoquinone Compound)

A four-necked separable flask equipped with a thermometer, a stirrer, a raw material inlet, and a dry nitrogen gas feed pipe was charged with 12.74 g (0.030 mol) of the phenol compound shown by the following formula (E-1) and 7.59 g (0.075 mol) of triethylamine. 103 g of acetone was added to the flask to dissolve the components. After cooling the reaction mixture to 10° C. or less, 20.15 g (0.075 mol) of 1,2-naphthoquinone-2-diazido-5-sulfonyl chloride was slowly added dropwise to the reaction mixture together with 100 g of acetone while maintaining the temperature of the reaction mixture at less than 10° C. After stirring the mixture at 10° C. or less for 5 minutes, the mixture was stirred at room temperature for 5 hours to complete the reaction. The reaction mixture was filtered, and poured into a water/methanol (=3/1 (volume ratio)) mixture. The resulting precipitate was collected by filtration, sufficiently washed with water, and dried under vacuum to obtain a photosensitive diazoquinone compound shown by the following formula (B-1).

(Synthesis of Photosensitive Diazoquinone Compound)

A four-necked separable flask equipped with a thermometer, a stirrer, a raw material inlet, and a dry nitrogen gas feed pipe was charged with 15.82 g (0.025 mol) of the phenol compound shown by the following formula (E-2) and 7.59 g (0.075 mol) of triethylamine. 113 g of tetrahydrofuran was added to the flask to dissolve the components. After cooling the reaction mixture to 10° C. or less, 20.15 g (0.075 mol) of 1,2-naphthoquinone-2-diazido-4-sulfonyl chloride was slowly added dropwise to the reaction mixture together with 100 g of tetrahydrofuran while maintaining the temperature of the reaction mixture at less than 10° C. After stirring the mixture at 10° C. or less for 5 minutes, the mixture was stirred at room temperature for 5 hours to complete the reaction. The reaction mixture was filtered, and poured into a water/methanol (=3/1 (volume ratio)) mixture. The resulting precipitate was collected by filtration, sufficiently washed with water, and dried under vacuum to obtain a photosensitive diazoquinone compound shown by the following formula (B-2).
(Production of Positive Photosensitive Resin Composition)

100 g of the polybenzoxazole precursor resin (A-1), 19 g of the photosensitive diazoquinone compound shown by the formula (B-1), 4 g of the hindered phenol antioxidant shown by the following formula (C-1), 10 g of the phenol compound shown by the following formula (D-1), and 8 g of 3-methacryloxypropyltrimethoxysilane were dissolved in 200 g of γ-butyrolactone. The solution was filtered through a Teflon (registered trademark) filter (pore size: 0.2 μm) to obtain a positive photosensitive resin composition.
(Evaluation of Workability)

The positive photosensitive resin composition was applied to a silicon wafer using a spin coater, and prebaked at 120° C. for 4 minutes using a hot plate to obtain a film having a thickness of about 8 μm. The film was irradiated using an i-line stepper ("4425i" manufactured by Nikon Corporation) via a mask (Test Chart No. 1 manufactured by Toppan Printing Co., Ltd. (a line pattern and a space pattern having a width of 0.88 to 50 μm were drawn)) while changing the dose.

The film was subjected to puddle development using a 2.38% tetramethylammonium hydroxide aqueous solution while adjusting the development time so that the difference between the thickness of the unexposed area after prebaking and the thickness of the unexposed area after development was 1 μm. The film was then rinsed with purified water for 10 seconds. A scum-free pattern was formed by the area irradiated at a dose of 280 mJ/cm$^2$ (sensitivity: 280 mJ/cm$^2$). The resolution was as high as 4 μm.
(Evaluation of Discoloration)

The positive photosensitive resin composition was applied to a quartz plate using a spin coater, and prebaked at 120° C. for 4 minutes using a hot plate. The composition was cured by heating the quartz plate using a clean oven (150° C./30 min and 320° C./30 min) while purging nitrogen at a flow rate of 100 l/min to form a cured film having a thickness of 10 μm. The transmittance (T1) of the cured film measured at 500 nm using a spectrophotometer was 60.1%. The quartz plate was then heated at 400° C. for 30 seconds using a hot plate, and the transmittance (T2) of the cured film was measured at 500 nm using the spectrophotometer. The transmittance (T2) of the cured film thus measured was 39.9%. The attenuation rate calculated by "100−[{(transmittance (T2) after heating at 400° C. for 30 seconds)/(transmittance (T1) after curing)}× 100]" was 33.6%. It was thus confirmed that the film was discolored to only a small extent.
(Evaluation of Adhesion to Substrate)

The positive photosensitive resin composition was applied to a 6-inch silicon wafer, a silicon wafer provided with an SiO$_2$ film, or a silicon wafer provided with a Si$_3$N$_4$ film using a spin coater, and prebaked at 120° C. for 4 minutes using a hot plate to obtain a wafer on which a film having a thickness of about 6 μm was formed. The film was cured by heating the wafer using a clean oven (150° C./30 min and 280° C./30 min) while purging nitrogen at a flow rate of 100 l/min to form a cured film having a thickness of about 5 μm.

The adhesion of the cured film was evaluated in accordance with JIS D 0202. Specifically, the cured film formed on the wafer was cut using a cutter so that one hundred 1×1 mm squares (10 rows and 10 columns) were formed, and treated using a pressure cooker for 100 hours at a temperature of 125° C. and a humidity of 100% under a pressure of 0.23 MPa. Scotch tape (registered trademark) was firmly attached to the cured film so that the entire square pattern formed on the wafer was covered, and then immediately removed. The number of squares among the one hundred squares that were peeled off was measured.

Example 2

A positive photosensitive resin composition was produced and evaluated in the same manner as in Example 1, except that 15 g of the photosensitive diazoquinone compound shown by the formula (B-2) was used instead of 19 g of the photosensitive diazoquinone compound shown by the formula (B-1), and 8 g of the phenol compound shown by the formula (D-2) was used instead of 10 g of the phenol compound shown by the formula (D-1).

Example 3

A positive photosensitive resin composition was produced in the same manner as in Example 2, and evaluated in the same manner as in Example 1, except that 5 g of the phenol compound shown by the formula (D-1) and 5 g of the phenol compound shown by the formula (D-2) were used instead of 8 g of the phenol compound shown by the formula (D-2).

Example 4

A polybenzoxazole precursor resin (A-2) having a number average molecular weight of 15,600 in which the structural units shown by the general formulas (5-4) and (5-5) were randomly copolymerized, was obtained in the same manner as in Example 1, except that the amount of the dicarboxylic acid derivative obtained by reacting 1 mol of diphenyl ether-4,4'-dicarboxylic acid with 2 mol of 1-hydroxybenzotriazole was changed to 423.52 g (0.86 mol), the molar ratio of hexafluoro-2,2-bis(3-amino-4-hydroxyphenyl)propane was reduced to 0.20 mol, 206.66 g (0.80 mol) of 2,2-bis(3-amino-4-hydroxyphenyl)propane was additionally used, and the amount of 5-norbornene-2,3-dicarboxylic anhydride was changed to 45.96 g (0.28 mol).

A positive photosensitive resin composition was produced and evaluated in the same manner as in Example 1, except that 100 g of the polybenzoxazole precursor resin (A-2) was used instead of 100 g of the polybenzoxazole precursor resin (A-1), 17 g of the photosensitive diazoquinone compound shown by the formula (B-2) was used instead of 19 g of the photosensitive diazoquinone compound shown by the formula (B-1), 10 g of the phenol compound shown by the formula (D-2) was used instead of 10 g of the phenol compound shown by the formula (D-1), and the components were dissolved in 200 g of a mixture of N-methyl-2-pyrrolidone and γ-butyrolactone (weight ratio: 15:85).

Example 5

A polybenzoxazole precursor resin (A-3) having a number average molecular weight of 12,100 in which the structural units shown by the general formulas (5-4) and (5-5) were randomly copolymerized, was obtained in the same manner as in Example 1, except that the amount of the dicarboxylic acid derivative obtained by reacting 1 mol of diphenyl ether-4,4'-dicarboxylic acid with 2 mol of 1-hydroxybenzotriazole was changed to 413.67 g (0.84 mol), the molar ratio of hexafluoro-2,2-bis(3-amino-4-hydroxyphenyl)propane was reduced to 0.85 mol, 32.44 g (0.15 mol) of 3,3'-diaminobiphenyl-4,4'-diol was additionally used, and the amount of 5-norbornene-2,3-dicarboxylic anhydride was changed to 52.53 g (0.32 mol).

A positive photosensitive resin composition was produced and evaluated in the same manner as in Example 1, except that 100 g of the polybenzoxazole precursor resin (A-3) was used instead of 100 g of the polybenzoxazole precursor resin (A-1), 9 g of the photosensitive diazoquinone compound shown by the formula (B-1) and 11 g of the photosensitive diazoquinone compound shown by the formula (B-2) were used instead of 19 g of the photosensitive diazoquinone compound shown by the formula (B-1), 3 g of the phenol compound shown by the formula (D-1) and 8 g of the phenol compound shown by the formula (D-2) were used instead of 10 g of the phenol compound shown by the formula (D-1), and the components were dissolved in 200 g of a mixture of N-methyl-2-pyrrolidone and γ-butyrolactone (weight ratio: 20:80).

Example 6

A four-necked separable flask equipped with a thermometer, a stirrer, a raw material inlet, and a dry nitrogen gas feed pipe was charged with 387.16 g (0.850 mol) of a dicarboxylic acid derivative (active ester) obtained by reacting 0.340 mol of isophthalic acid, 0.510 mol of diphenyl ether-4,4'-dicarboxylic acid, and 1.700 mol of 1-hydroxy-1,2,3-benzotriazole, 171.82 g (0.600 mol) of 4,4'-methylenebis(2-amino-3,6-dimethylphenol), and 92.11 g (0.400 mol) of 3,3'-diamino-4,4'-dihydroxydiphenylmethane. 1600 g of N-methyl-2-pyrrolidone was added to the flask to dissolve the components. The mixture was then reacted at 75° C. for 16 hours using an oil bath.

After the addition of 51.64 g (0.300 mol) of 4-ethynylphthalic anhydride dissolved in 200 g of N-methyl-2-pyrrolidone, the mixture was stirred for 3 hours to complete the reaction. The reaction mixture was filtered, and poured into a water/isopropanol (=3/1) mixture. The resulting precipitate was collected by filtration, sufficiently washed with water, and dried under vacuum to obtain the target polybenzoxazole precursor resin (A-4) having a number average molecular weight of 9100 in which the structural units shown by the general formulas (5-4) and (5-5) were randomly copolymerized.

A positive photosensitive resin composition was produced in the same manner as in Example 5, and evaluated in the same manner as in Example 1, except that 100 g of the polybenzoxazole precursor resin (A-4) was used instead of 100 g of the polybenzoxazole precursor resin (A-3), 5 g of the photosensitive diazoquinone compound shown by the formula (B-1) and 12 g of the photosensitive diazoquinone compound shown by the formula (B-2) were used instead of 9 g of the photosensitive diazoquinone compound shown by the formula (B-1) and 11 g of the photosensitive diazoquinone compound shown by the formula (B-2), the amount of the hindered phenol antioxidant shown by the formula (C-1) was reduced from 4 g to 2 g, and 5 g of the phenol compound shown by the formula (D-2) was used instead of 3 g of the phenol compound shown by the formula (D-1) and 8 g of the phenol compound shown by the formula (D-2).

Example 7

A polybenzoxazole precursor resin (A-5) having a number average molecular weight of 7400 in which the structural units shown by the general formulas (5-4) and (5-5) were randomly copolymerized, was obtained in the same manner as in Example 6, except that the molar ratio of isophthalic acid was changed to 0.168 mol, the molar ratio of diphenyl ether-4,4'-dicarboxylic acid was changed to 0.672 mol, 150.20 g (0.500 mol) of 4,4'-ethylidenebis(2-amino-3,6-dimethylphenol) was used instead of 4,4'-methylenebis(2-amino-3,6-dimethylphenol), the amount of 3,3'-diamino-4,4'-dihydroxydiphenylmethane was changed to 115.14 g (0.500 mol), and the amount of 4-ethynylphthalic anhydride was changed to 55.08 g (0.320 mol).

A positive photosensitive resin composition was produced in the same manner as in Example 5, and evaluated in the same manner as in Example 1, except that 100 g of the polybenzoxazole precursor resin (A-5) was used instead of 100 g of the polybenzoxazole precursor resin (A-3), 5 g of the photosensitive diazoquinone compound shown by the formula (B-1) and 12 g of the photosensitive diazoquinone compound shown by the formula (B-2) were used instead of 9 g of the photosensitive diazoquinone compound shown by the formula (B-1) and 11 g of the photosensitive diazoquinone compound shown by the formula (B-2), the amount of the hindered phenol antioxidant shown by the formula (C-1) was reduced from 4 g to 2 g, and 5 g of the phenol compound shown by the formula (D-1) and 5 g of the phenol compound shown by the formula (D-2) were used instead of 3 g of the phenol compound shown by the formula (D-1) and 8 g of the phenol compound shown by the formula (D-2).

Example 8

A four-necked separable flask equipped with a thermometer, a stirrer, a raw material inlet, and a dry nitrogen gas feed pipe was charged with 19.83 g (0.100 mol) of 4,4'-diaminodiphenylmethane and 2900 g of N-methyl-2-pyrrolidone to obtain a solution. 28.54 g (0.0920 mol) of 4,4'-oxydiphthalic anhydride was slowly added to the solution while cooling the flask with water. After reacting the mixture at room temperature for 2 hours, 329.63 g (0.900 mol) of hexafluoro-2,2-bis (3-amino-4-hydroxyphenyl)propane was added to the mixture together with 100 g of N-methyl-2-pyrrolidone. The mixture was then reacted at room temperature for 1 hour. After the addition of 407.76 g (0.828 mol) of a dicarboxylic acid derivative (active ester) obtained by reacting 0.828 mol of diphenyl ether-4,4'-dicarboxylic acid with 1.656 mol of 1-hydroxy-1,2,3-benzotriazole together with 100 g of N-methyl-2-pyrrolidone, the mixture was reacted at 60° C. for 14 hours using an oil bath. After the addition of 26.27 g (0.160 mol) of 5-norbornene-2,3-dicarboxylic anhydride dissolved in 100 g of N-methyl-2-pyrrolidone, the mixture was stirred for 3 hours to complete the reaction. The reaction mixture was filtered, and poured into a water/isopropanol (=3/1) mixture. The resulting precipitate was collected by filtration, sufficiently washed with water, and dried under vacuum to obtain the target polybenzoxazole precursor resin (A-6) having a number average molecular weight of 12,800 in which the structural unit shown by the general formula (5-1), the structural unit shown by the general formula (5-2), the structural unit shown by the general formula (5-3) wherein g is 2 and $R_6$ represents a carboxylic acid, and the structural unit shown by the general formula (5-5) were randomly copolymerized.

A positive photosensitive resin composition was produced in the same manner as in Example 3, and evaluated in the same manner as in Example 1, except that 100 g of the polybenzoxazole precursor resin (A-6) was used instead of 100 g of the polybenzoxazole precursor resin (A-1), the amount of the photosensitive diazoquinone compound shown by the formula (B-2) was changed from 15 g to 19 g, the amount of the hindered phenol antioxidant shown by the formula (C-1) was changed from 4 g to 1 g, and 5 g of the phenol compound shown by the formula (D-1) and 9 g of the phenol compound shown by the formula (D-2) were used instead of 5 g of the phenol compound shown by the formula (D-1) and 5 g of the phenol compound shown by the formula (D-2).

Comparative Example 1

A positive photosensitive resin composition was produced and evaluated in the same manner as in Example 1, except that 4 g of the antioxidant shown by the formula (F-1) was used instead of 4 g of the hindered phenol antioxidant shown by the formula (C-1).

Comparative Example 2

A positive photosensitive resin composition was produced and evaluated in the same manner as in Example 1, except that the amount of the hindered phenol antioxidant shown by the formula (C-1) was changed from 4 g to 0 g, and the amount of the phenol compound shown by the formula (D-1) was changed from 10 g to 0 g.

Comparative Example 3

A positive photosensitive resin composition was produced and evaluated in the same manner as in Example 1, except that the amount of the hindered phenol antioxidant shown by the formula (C-1) was changed from 4 g to 0 g.

Comparative Example 4

A positive photosensitive resin composition was produced in the same manner as in Example 2, and evaluated in the same manner as in Example 1, except that the amount of the hindered phenol antioxidant shown by the formula (C-1) was changed from 4 g to 0 g.

Comparative Example 5

A positive photosensitive resin composition was produced and evaluated in the same manner as in Example 1, except that the amount of the phenol compound shown by the formula (D-1) was changed from 10 g to 0 g.

Comparative Example 6

A positive photosensitive resin composition was produced in the same manner as in Example 2, and evaluated in the same manner as in Example 1, except that 8 g of the phenol compound shown by the formula (G-1) was used instead of 8 g of the phenol compound shown by the formula (D-2).

Comparative Example 7

A positive photosensitive resin composition was produced in the same manner as in Example 4, and evaluated in the same manner as in Example 1, except that the amount of the hindered phenol antioxidant shown by the formula (C-1) was changed from 4 g to 0 g.

Comparative Example 8

A positive photosensitive resin composition was produced in the same manner as in Example 5, and evaluated in the same manner as in Example 1, except that the amount of the hindered phenol antioxidant shown by the formula (C-1) was changed from 4 g to 0 g.

Comparative Example 9

A positive photosensitive resin composition was produced in the same manner as in Example 8, and evaluated in the same manner as in Example 1, except that the amount of the phenol compound shown by the formula (D-1) was changed from 5 g to 0 g, and the amount of the phenol compound shown by the formula (D-2) was changed from 9 g to 0 g.

Comparative Examples 1, 2, 3, and 5 correspond to Example 1, Comparative Examples 4 and 6 correspond to Example 2, Comparative Example 7 corresponds to Example 4, Comparative Example 8 corresponds to Example 5, and Comparative Example 9 corresponds to Example 8.

A semiconductor device may be obtained by applying the positive photosensitive resin composition obtained in each example or comparative example to a semiconductor element to form a pattern in the same manner as in Example 1, and curing the composition using an oven to form a protective film.

The semiconductor device thus obtained is expected to operate normally. Since a cured film of the positive photosensitive resin composition obtained in each of Examples 1 to 8 is discolored to only a small extent and exhibits high adhesion to various substrates as compared with a cured film of the positive photosensitive resin composition obtained in each comparative example, the semiconductor device obtained using the positive photosensitive resin composition obtained in each of Examples 1 to 8 is expected to operate more reliably as compared with the semiconductor device obtained using the positive photosensitive resin composition obtained in each comparative example.

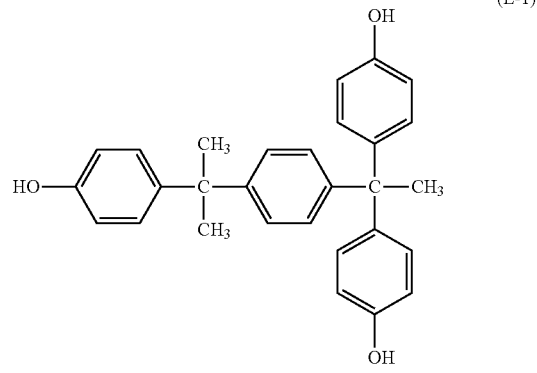

(E-1)

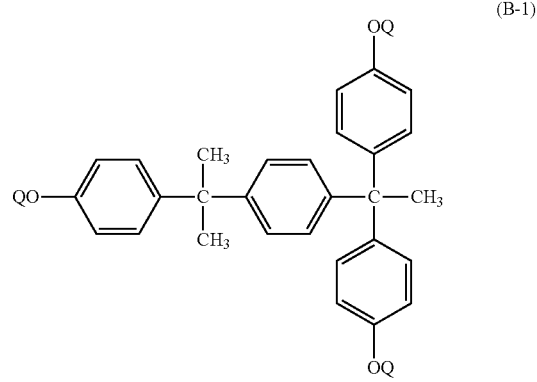

(B-1)

(wherein Q represents a hydrogen atom or 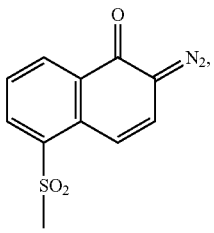
provided that 83% of Q represents 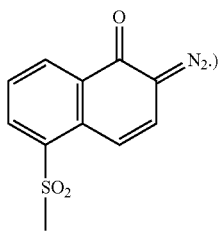)
(E-2)
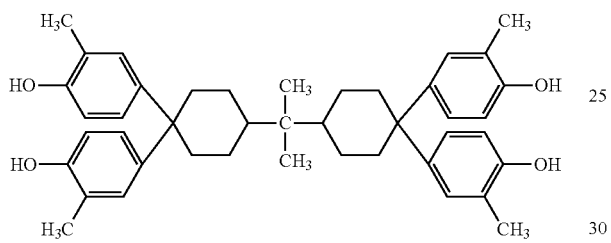
(B-2)
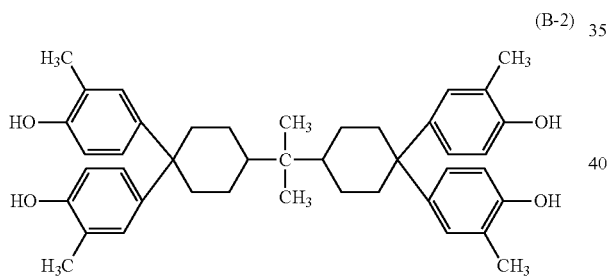
(wherein Q represents a hydrogen atom or 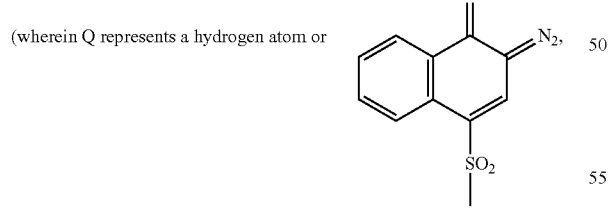
provided that 75% of Q represents 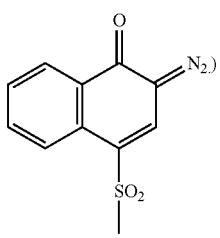)
(C-1)
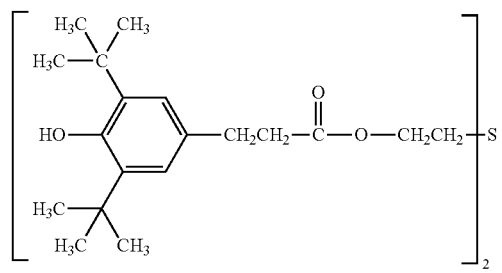
(D-1)
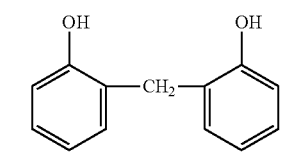
(D-2)
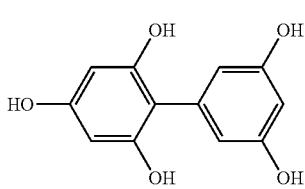
(F-1)
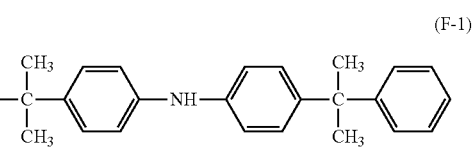
(G-1)
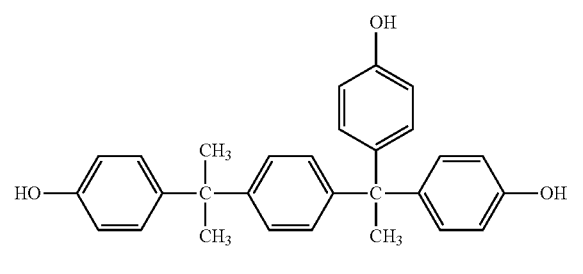

TABLE 1

| | Component Polybenzoxazole precursor resin (A) (100 g) | | |
|---|---|---|---|
| | Amine (molar ratio) | Acid (molar ratio) | Type |
| Example 1 | Hexafluoro-2,2-bis(3-amino-4-hydroxyphenyl)propane (1.00) | Diphenyl ether-4,4'-dicarboxylic acid (0.90) | A-1 |
| Example 2 | Hexafluoro-2,2-bis(3-amino-4-hydroxyphenyl)propane (1.00) | Diphenyl ether-4,4'-dicarboxylic acid (0.90) | A-1 |
| Example 3 | Hexafluoro-2,2-bis(3-amino-4-hydroxyphenyl)propane (1.00) | Diphenyl ether-4,4'-dicarboxylic acid (0.90) | A-1 |
| Example 4 | 2,2-Bis(3-amino-4-hydroxyphenyl)propane (0.80), hexafluoro-2,2-bis(3-amino-4-hydroxyphenyl)propane (0.20) | Diphenyl ether-4,4'-dicarboxylic acid (0.86) | A-2 |
| Example 5 | Hexafluoro-2,2-bis(3-amino-4-hydroxyphenyl)propane (0.85), 3,3'-diaminobiphenyl-4,4'-diol (0.15) | Diphenyl ether-4,4'-dicarboxylic acid (0.84) | A-3 |
| Example 6 | 4,4'-Methylenebis(2-amino-3,6-dimethylphenol) (0.60), 3,3'-diamino-4,4'-dihydroxydiphenylmethane (0.40) | Isophthalic acid (0.34), diphenyl ether-4,4'-dicarboxylic acid (0.51) | A-4 |
| Example 7 | 4,4'-Ethylidenebis(2-amino-3,6-dimethylphenol) (0.50), 3,3'-diamino-4,4'-dihydroxydiphenylmethane (0.50) | Isophthalic acid (0.17), diphenyl ether-4,4'-dicarboxylic acid (0.67) | A-5 |
| Example 8 | Hexafluoro-2,2-bis(3-amino-4-hydroxyphenyl)propane (0.90), 4,4'-diaminodiphenylmethane (0.10) | Diphenyl ether-4,4'-dicarboxylic acid (0.83), 4,4'-oxydiphthalic anhydride (0.09) | A-6 |
| Comparative Example 1 | Hexafluoro-2,2-bis(3-amino-4-hydroxyphenyl)propane (1.00) | Diphenyl ether-4,4'-dicarboxylic acid (0.90) | A-1 |
| Comparative Example 2 | Hexafluoro-2,2-bis(3-amino-4-hydroxyphenyl)propane (1.00) | Diphenyl ether-4,4'-dicarboxylic acid (0.90) | A-1 |
| Comparative Example 3 | Hexafluoro-2,2-bis(3-amino-4-hydroxyphenyl)propane (1.00) | Diphenyl ether-4,4'-dicarboxylic acid (0.90) | A-1 |
| Comparative Example 4 | Hexafluoro-2,2-bis(3-amino-4-hydroxyphenyl)propane (1.00) | Diphenyl ether-4,4'-dicarboxylic acid (0.90) | A-1 |
| Comparative Example 5 | Hexafluoro-2,2-bis(3-amino-4-hydroxyphenyl)propane (1.00) | Diphenyl ether-4,4'-dicarboxylic acid (0.90) | A-1 |
| Comparative Example 6 | Hexafluoro-2,2-bis(3-amino-4-hydroxyphenyl)propane (1.00) | Diphenyl ether-4,4'-dicarboxylic acid (0.90) | A-1 |
| Comparative Example 7 | 2,2-Bis(3-amino-4-hydroxyphenyl)propane (0.80), hexafluoro-2,2-bis(3-amino-4-hydroxyphenyl)propane (0.20) | Diphenyl ether-4,4'-dicarboxylic acid (0.86) | A-2 |
| Comparative Example 8 | Hexafluoro-2,2-bis(3-amino-4-hydroxyphenyl)propane (0.85), 3,3'-diaminobiphenyl-4,4'-diol(0.15) | Diphenyl ether-4,4'-dicarboxylic acid (0.84) | A-3 |
| Comparative Example 9 | Hexafluoro-2,2-bis(3-amino-4-hydroxyphenyl)propane (0.90), 4,4'-diaminodiphenylmethane (0.10) | Diphenyl ether-4,4'-dicarboxylic acid (0.83), 4,4'-oxydiphthalic anhydride (0.09) | A-6 |

| | Component | | | | | |
|---|---|---|---|---|---|---|
| | Polybenzoxazole precursor resin (A) (100 g) | | Photosensitive | | | |
| | Number average molecular weight | Dissolution rate (nm/sec) | diazoquinone compound (B) | Hindered phenol antioxidant (C) | Phenol compound (D) | (D)/(C) |
| Example 1 | 12000 | 88.4 | B-1: 19 g | C-1: 4 g | D-1: 10 g | 2.5 |
| Example 2 | 12000 | 88.4 | B-2: 15 g | C-1: 4 g | D-2: 8 g | 2.0 |
| Example 3 | 12000 | 88.4 | B-2: 15 g | C-1: 4 g | D-1: 5 g<br>D-2: 5 g | 2.5 |
| Example 4 | 15600 | 76.4 | B-2: 17 g | C-1: 4 g | D-2: 10 g | 2.5 |
| Example 5 | 12100 | 100.2 | B-1: 9 g<br>B-2: 11 g | C-1: 4 g | D-1: 3 g<br>D-2: 8 g | 2.8 |
| Example 6 | 9100 | 50.1 | B-1: 5 g<br>B-2: 12 g | C-1: 2 g | D-2: 5 g | 2.5 |
| Example 7 | 7400 | 42.6 | B-1: 5 g<br>B-2: 12 g | C-1: 2 g | D-1: 5 g<br>D-2: 5 g | 5.0 |
| Example 8 | 12800 | 120.4 | B-2: 19 g | C-1: 1 g | D-1: 5 g<br>D-2: 9 g | 14.0 |
| Comparative Example 1 | 12000 | 88.4 | B-1: 19 g | F-1: 4 g | D-1: 10 g | 2.5 |
| Comparative Example 2 | 12000 | 88.4 | B-1: 19 g | — | — | — |
| Comparative Example 3 | 12000 | 88.4 | B-1: 19 g | — | D-1: 10 g | — |
| Comparative Example 4 | 12000 | 88.4 | B-2: 15 g | — | D-2: 8 g | — |
| Comparative Example 5 | 12000 | 88.4 | B-1: 19 g | C-1: 4 g | — | — |
| Comparative Example 6 | 12000 | 88.4 | B-2: 15 g | C-1: 4 g | G-1: 8 g | 2.8 |
| Comparative Example 7 | 15600 | 76.4 | B-2: 17 g | — | D-2: 10 g | — |
| Comparative Example 8 | 12100 | 100.2 | B-1: 9 g<br>B-2: 11 g | — | D-1: 3 g<br>D-2: 8 g | — |
| Comparative Example 9 | 12800 | 120.4 | B-2: 19 g | C-1: 1 g | — | — |

TABLE 2

|  | Sensitivity (mJ/cm$^2$) | Resolution (μm) | Scum | Transmittance after curing (%) | Transmittance after additional heating (%) | Transmittance attenuation rate (%) | Adhesion to substrate (number of squares that were peeled off) | | |
|---|---|---|---|---|---|---|---|---|---|
|  |  |  |  |  |  |  | Si | SiO$_2$ | Si$_3$N$_4$ |
| Example 1 | 280 | 4 | Absent | 60.1 | 39.9 | 33.6 | 5 | 6 | 7 |
| Example 2 | 170 | 3 | Absent | 47.2 | 26.3 | 44.3 | 0 | 2 | 0 |
| Example 3 | 200 | 4 | Absent | 51.0 | 31.4 | 38.4 | 3 | 6 | 4 |
| Example 4 | 180 | 3 | Absent | 39.0 | 20.1 | 48.5 | 0 | 0 | 0 |
| Example 5 | 220 | 4 | Absent | 37.2 | 19.8 | 46.8 | 0 | 0 | 0 |
| Example 6 | 230 | 3 | Absent | 48.9 | 32.0 | 34.6 | 0 | 3 | 1 |
| Example 7 | 250 | 3 | Absent | 37.3 | 24.8 | 33.5 | 1 | 4 | 5 |
| Example 8 | 300 | 4 | Absent | 56.0 | 29.6 | 47.1 | 0 | 0 | 0 |
| Comparative Example 1 | 300 | 5 | Absent | 63.8 | 38.1 | 40.3 | 58 | 61 | 85 |
| Comparative Example 2 | 350 | 7 | Present | 61.1 | 26.5 | 56.6 | 62 | 85 | 100 |
| Comparative Example 3 | 290 | 4 | Absent | 64.4 | 25.5 | 60.4 | 50 | 91 | 100 |
| Comparative Example 4 | 190 | 3 | Absent | 48.5 | 14.2 | 70.7 | 49 | 55 | 63 |
| Comparative Example 5 | 400 | 7 | Present | 58.6 | 39.7 | 32.3 | 28 | 29 | 38 |
| Comparative Example 6 | 310 | 6 | Absent | 50.3 | 30.5 | 39.4 | 10 | 8 | 18 |
| Comparative Example 7 | 200 | 3 | Absent | 31.0 | 8.7 | 71.9 | 60 | 63 | 93 |
| Comparative Example 8 | 240 | 4 | Absent | 30.8 | 8.3 | 73.1 | 66 | 70 | 81 |
| Comparative Example 9 | 390 | 9 | Absent | 57.2 | 31.3 | 45.3 | 31 | 24 | 32 |

INDUSTRIAL APPLICABILITY

The invention thus provides a positive photosensitive resin composition that exhibits high sensitivity and high resolution, and can produce a cured film that has a light color, is discolored to only a small extent due to heating, and exhibits high adhesion to a substrate. This makes it possible to produce a protective film and an interlayer insulating film that exhibit excellent performance, and a semiconductor device and a display element using the same.

The invention claimed is:

1. A positive photosensitive resin composition comprising (A) a polybenzoxazole precursor resin, (B) a photosensitive diazoquinone compound, (C) a hindered phenol antioxidant shown by a general formula (1), and (D) a phenol compound shown by a general formula (2),

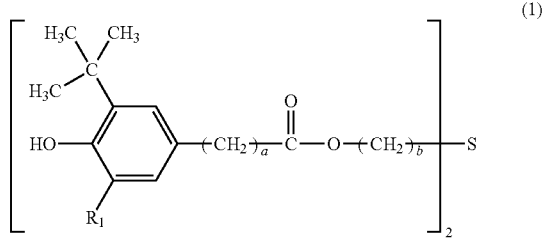

(1)

wherein R$_1$ represents a hydrogen atom or an organic group having 1 to 4 carbon atoms, a is an integer from 1 to 3, and b is an integer from 1 to 3,

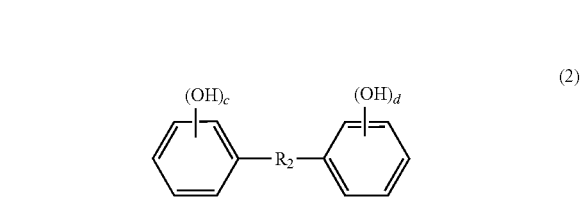

(2)

wherein R$_2$ represents a methylene group or a single bond, c is an integer from 1 to 3, and d is an integer from 1 to 3 wherein a ratio ((D)/(C)) of a content of the phenol compound (D) shown by the general formula (2) to a content of the hindered phenol antioxidant (C) shown by the general formula (1) is 1 to 50.

2. The positive photosensitive resin composition according to claim 1, comprising 1 to 50 parts by mass of the photosensitive diazoquinone compound (B), 1 to 20 parts by mass of the hindered phenol antioxidant (C) shown by the general formula (1), and 1 to 50 parts by mass of the phenol compound (D) shown by the general formula (2) based on 100 parts by mass of the polybenzoxazole precursor resin (A).

3. The positive photosensitive resin composition according to claim 1, wherein a ratio ((D)/(C)) of a content of the phenol compound (D) shown by the general formula (2) to a content of the hindered phenol antioxidant (C) shown by the general formula (1) is 1 to 20.

4. The positive photosensitive resin composition according to claim 1, wherein the polybenzoxazole precursor resin (A) includes at least one structural unit selected from the group consisting of structural units shown by a formula (3),

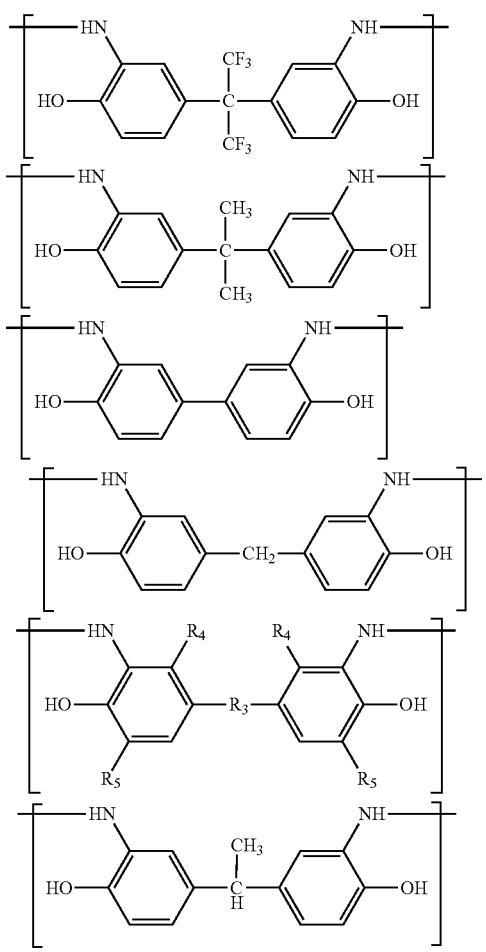

(3)

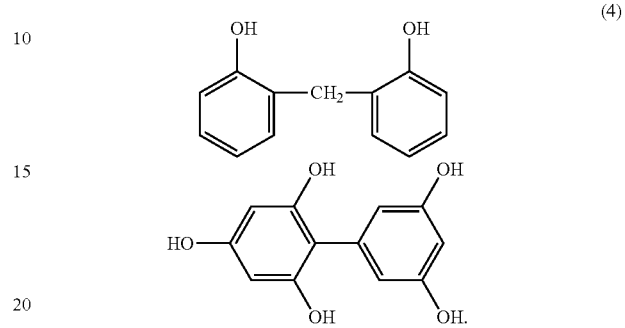

(4)

wherein R₃ represents a group selected from the group consisting of an alkylene group, a substituted alkylene group, —O—, —S—, —SO₂—, —CO—, —NHCO—, —C(CF₃)₂—, and a single bond, R₄ individually represent an alkyl group, an alkoxy group, an acyloxy group, or a cycloalkyl group, two R₄s may be the same or different, and R₅ individually represent a hydrogen atom, an alkyl group, an alkoxy group, an acyloxy group, or a cycloalkyl group, two R₅s may be the same or different.

5. The positive photosensitive resin composition according to claim 1, wherein the phenol compound (D) is at least one compound selected from the group consisting of compounds shown by a formula (4), 6. The positive photosensitive resin composition according to claim 1, wherein the polybenzoxazole precursor resin (A) has a dissolution rate in a 2.38% tetramethylammonium hydroxide aqueous solution of 10 to 300 nm/sec.

7. A cured film comprising a cured product of the positive photosensitive resin composition according to claim 1.

8. A protective film comprising the cured film according to claim 7.

9. An insulating film comprising the cured film according to claim 7.

10. A semiconductor device comprising the cured film according to claim 7.

11. A display device comprising the cured film according to claim 7.

12. The positive photosensitive resin composition according to claim 2, wherein the phenol compound (D) of the general formula (2) is in a concentration of 1 to 20 parts by mass, based on 100 parts by mass of the polybenzoxazole precursor resin (A).

13. The positive photosensitive resin composition according to claim 1, wherein the polybenzoxazole precursor resin (A) has a number average molecular weight (Mn) of 5000 to 40,000.

* * * * *